United States Patent
Takeuchi et al.

(10) Patent No.: US 12,140,624 B2
(45) Date of Patent: Nov. 12, 2024

(54) SEMICONDUCTOR DEVICE AND TEST SYSTEM

(71) Applicant: SONY SEMICONDUCTOR SOLUTIONS CORPORATION, Kanagawa (JP)

(72) Inventors: Keita Takeuchi, Kanagawa (JP); Satoshi Yamamoto, Kanagawa (JP); Kyoichi Takenaka, Kanagawa (JP); Keita Sasaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 56 days.

(21) Appl. No.: 17/904,723

(22) PCT Filed: Jan. 5, 2021

(86) PCT No.: PCT/JP2021/000060
§ 371 (c)(1),
(2) Date: Aug. 22, 2022

(87) PCT Pub. No.: WO2021/171785
PCT Pub. Date: Sep. 2, 2021

(65) Prior Publication Data
US 2023/0082419 A1 Mar. 16, 2023

(30) Foreign Application Priority Data
Feb. 28, 2020 (JP) .................................. 2020-034246

(51) Int. Cl.
*G01R 31/26* (2020.01)

(52) U.S. Cl.
CPC ................................ *G01R 31/2607* (2013.01)

(58) Field of Classification Search
CPC ............ G01R 31/2607; G01R 31/2853; G01R 31/2884; H01L 21/3205; H01L 21/768;
(Continued)

(56) References Cited

U.S. PATENT DOCUMENTS 5,359,604 A * 10/1994 Kondo .................. H04L 12/427
370/503
2012/0274348 A1* 11/2012 Shin .................... G01R 31/3008
324/762.01

(Continued)

FOREIGN PATENT DOCUMENTS

JP 2002-289623 A 10/2002
JP 2005-026346 A 1/2005
(Continued)

OTHER PUBLICATIONS

English Translation Ide JP 2018189604 A "Diagnostic Circuit and Control Method of Diagnostic Circuit" (Year: 2018).*

(Continued)

*Primary Examiner* — Eman A Alkafawi
*Assistant Examiner* — Courtney G McDonnough
(74) *Attorney, Agent, or Firm* — CHIP LAW GROUP

(57) ABSTRACT

The degree of freedom of an abnormality detection target location in a solid-state imaging device in which a plurality of substrates are joined is improved. A semiconductor device includes a connection line and a detection circuit. A plurality of semiconductor substrates are joined in the semiconductor device. Then, in the semiconductor device, the connection line is wired across the plurality of semiconductor substrates. The detection circuit detects the presence or absence of an abnormality in a joint surface of the plurality of semiconductor substrates based on an energization state of the connection line when enable has been set by a predetermined control signal.

11 Claims, 24 Drawing Sheets

(58) Field of Classification Search
CPC . H01L 21/822; H01L 21/8234; H01L 23/522;
H01L 27/04; H01L 27/06; H01L 27/088;
H01L 27/146; H04N 25/69; H04N 25/79
USPC .................................................. 324/762.01
See application file for complete search history.

(56) References Cited

U.S. PATENT DOCUMENTS

2013/0285055 A1* 10/2013 Takayanagi ........... H01L 23/522
257/48
2014/0014958 A1* 1/2014 Oh ......................... H01L 22/00
257/48
2019/0318470 A1 10/2019 Jung

FOREIGN PATENT DOCUMENTS

| JP | 2012-235114 A | 11/2012 |
| JP | 2013-131688 A | 7/2013 |
| JP | 2013-232481 A | 11/2013 |
| JP | 2018-101699 A | 6/2018 |
| JP | 2018189604 A * | 11/2018 |
| WO | 2011/030467 A1 | 3/2011 |
| WO | 2017/209221 A1 | 12/2017 |

OTHER PUBLICATIONS

International Search Report and Written Opinion of PCT Application No. PCT/JP2021/000060, issued on Mar. 30, 2021, 15 pages of ISRWO.

* cited by examiner

Fig. 4

| xDETEN | TSTIN | xTSTIN |
|---|---|---|
| 0 (ENABLE) | X | HiZ |
| 1 (DISABLE) | 0 | H |
| 1 (DISABLE) | 1 | L |

Fig. 8

| CONTROL SIGNAL DETEN | TEST SIGNAL TSTIN | DETECTION SIGNAL DETOUT | ABNORMALITY OF JOINT SURFACE | |
|---|---|---|---|---|
| | | | BEFORE BONDING | AFTER BONDING |
| 1 (ENABLE) | X | H (NOT CONDUCTIVE) | ABSENCE | PRESENCE (PEELING, ETC.) |
| | | L (CONDUCTIVE) | PRESENCE (SHORT CIRCUIT) | ABSENCE |

Fig. 9

| CONTROL SIGNAL DETEN | TEST SIGNAL TSTIN | DETECTION SIGNAL DETOUT | FAILURE OF DETECTION CIRCUIT |
|---|---|---|---|
| 0 (DISABLE) | 1 | H | ABSENCE |
| | | L | PRESENCE |
| | 0 | H | PRESENCE |
| | | L | ABSENCE |

| MODE OF DETECTION CIRCUIT | ENABLE SIGNAL | OPERATION OF DETECTION CIRCUIT |
|---|---|---|
| ABNORMALITY DETECTION MODE | 1 (ENABLE) | DETECT PRESENCE OR ABSENCE OF ABNORMALITY OF JOINT SURFACE |
| TEST PASSAGE CHECK MODE | 0 (DISABLE) | OUTPUT ACCORDING TO TEST SIGNAL |

Fig. 22A

| MODE OF DETECTION CIRCUIT CONTROL UNIT | OPERATION OF DETECTION CIRCUIT CONTROL UNIT |
|---|---|
| MANUAL MODE | OUTPUT ENABLE IN RESPONSE TO OPERATION SIGNAL |
| AUTORUN MODE | OUTPUT ENABLE IN SYNCHRONIZATION WITH XVS OR IN RESPONSE TO OPERATION SIGNAL |

Fig. 22B

| MODE OF TEST DEVICE | OPERATION OF TEST DEVICE |
|---|---|
| DEBUG MODE | ANALYZE TOUT_Debug |
| TEST MODE | ANALYZE TOUT_Tester |

Fig. 22C

SEMICONDUCTOR DEVICE AND TEST SYSTEM

CROSS REFERENCE TO RELATED APPLICATIONS

This application is a U.S. National Phase of International Patent Application No. PCT/JP2021/000060 filed on Jan. 5, 2021, which claims priority benefit of Japanese Patent Application No. JP 2020-034246 filed in the Japan Patent Office on Feb. 28, 2020. Each of the above-referenced applications is hereby incorporated herein by reference in its entirety.

TECHNICAL FIELD

The present technology relates to a semiconductor device. More particularly, the present technology relates to a semiconductor device that detects the presence or absence of an abnormality in the semiconductor device and a test system for the same.

BACKGROUND ART

In recent years, semiconductor devices have become more diverse in terms of required functions and are becoming more multifunctional and highly integrated. A semiconductor device having a stacked structure in which a plurality of semiconductor substrates are bonded together and stacked has been used to achieve multiple functions and high integration. For example, a solid-state imaging device in which pixels are arranged on an upper substrate and a row drive unit and a failure detection unit are arranged on a lower substrate and the failure detection unit detects a failure by performing analysis of the output timing of a pulse signal from the row drive unit to pixels and determination of an expected value associated with a voltage that has been applied to a vertical signal line and AD converted has been proposed (see, for example, PTL 1).

CITATION LIST

Patent Literature

[PTL 1]
WO 2017/209221

SUMMARY

Technical Problem

The above technology of the related art detects the presence or absence of a failure of the pixel array unit in which pixels are arranged through the analysis of the output timing of a pulse signal from the row drive unit to pixels and the determination of an expected value associated with a voltage that has been applied to a vertical signal line and AD converted. However, the above technology of the related art cannot detect the presence or absence of an abnormality occurring in an area other than the pixel array unit. This is because even if an abnormality such as peeling of a substrate occurs in an area other than the pixel array unit, this occurrence does not affect the output timing of the pulse signal. Thus, the above technology of the related art has a problem that the abnormality detection target location is limited to the pixel array unit and the degree of freedom of the detection target location is low.

The present technology has been made in view of such circumstances and it is an object of the present technology to improve the degree of freedom of an abnormality detection target location in a solid-state imaging device in which a plurality of substrates are joined.

Solution to Problem

A first aspect of the present technology is a semiconductor device including a connection line that is wired across a plurality of semiconductor substrates to be joined, and a detection circuit configured to detect the presence or absence of an abnormality in a joint surface of the plurality of semiconductor substrates based on an energization state of the connection line. This has the effect of detecting the presence or absence of an abnormality in the joint surface at any location.

In the first aspect, the detection circuit may include a resistor and an output-side logic gate configured to output a result of a logical operation performed on a potential at one end of the resistor. This has the effect of outputting a result of a logical operation indicating the presence or absence of an abnormality.

In the first aspect, the detection circuit may further include a transistor configured to be turned on when enable has been set by a predetermined control signal. This has the effect of detecting the presence or absence of an abnormality when enable has been set.

In the first aspect, the transistor may be inserted in at least one of a path between one end of the connection line and a power source, a path between the other end of the connection line and the resistor, and a path between the resistor and a reference potential. This has the effect of opening and closing the path according to enable setting.

In the first aspect, the detection circuit may further include an input-side logic gate configured to output a result of a logic operation performed on an input test signal to the output-side logic gate when disable has been set by the control signal. This has the effect of detecting the presence or absence of a failure in the detection circuit.

In the first aspect, a predetermined number of detection circuits may be arranged in the semiconductor device and the predetermined number of detection circuits may be configured to output detection signals indicating detection results of different detection target locations. This has the effect of detecting the presence or absence of an abnormality at a predetermined number of detection target locations.

In the first aspect, the semiconductor device may further include a result aggregation unit configured to generate an output signal indicating the presence or absence of an abnormality in at least one of the detection target locations based on the detection signals. This has the effect of aggregating the detection signals.

In the first aspect, the semiconductor device may further include a result holding unit configured to hold the output signal and the detection signals. This has the effect that the held values are read by the detection unit.

In the first aspect, the semiconductor device may further include a detection control unit configured to generate and supply the control signal to the detection circuit. This has the effect that the operation of the detection circuit is controlled by the detection control unit.

In the first aspect, the detection control unit may be configured to supply the control signal that has been set to enable over a predetermined period when a predetermined operation signal has been input. This has the effect of manually detecting the presence or absence of an abnormality.

In the first aspect, the detection control unit may be configured to supply the control signal that has been set to enable over a predetermined period in synchronization with a predetermined synchronization signal. This has the effect of detecting the presence or absence of an abnormality in synchronization with the synchronization signal.

In the first aspect, the connection line may include a plurality of pairs of copper wirings joined to each other and metal wirings that connect the plurality of pairs of copper wirings in a daisy chain. This has the effect of detecting the presence or absence of an abnormality in the joint surface of a daisy chain structure.

A second aspect of the present technology is a test system including a connection line that is wired across a plurality of semiconductor substrates to be joined, a detection circuit configured to detect the presence or absence of an abnormality in a joint surface of the plurality of semiconductor substrates based on an energization state of the connection line when enable has been set by a predetermined control signal, and a detection unit configured to detect the presence or absence of a failure of the detection circuit when disable has been set by the control signal. This has the effect of detecting the presence or absence of an abnormality in the joint surface and the presence or absence of a failure in the detection circuit.

BRIEF DESCRIPTION OF DRAWINGS

FIG. 4 is a diagram showing an example of a truth table of an inverter according to the first embodiment of the present technology.

FIG. 8 is a diagram showing an example of an operation of a detection circuit in an abnormality detection mode according to the first embodiment of the present technology.

FIG. 9 is a diagram showing an example of an operation of the detection circuit in a test passage check mode according to the first embodiment of the present technology.

FIGS. 22A, 22B, and 22C are diagrams summarizing modes set in the test system according to the second embodiment of the present technology.

DESCRIPTION OF EMBODIMENTS

Hereinafter, modes for implementing the present technology (hereinafter referred to as embodiments) will be described. A description will be given in the following order.
1. First embodiment (with examples in which abnormality is detected based on energization state of connection line)
2. Second embodiment (with examples in which abnormality is detected based on energization state of connection line and detection results are held)
3. Exemplary application to moving body 1. First Embodiment

Figure 1:
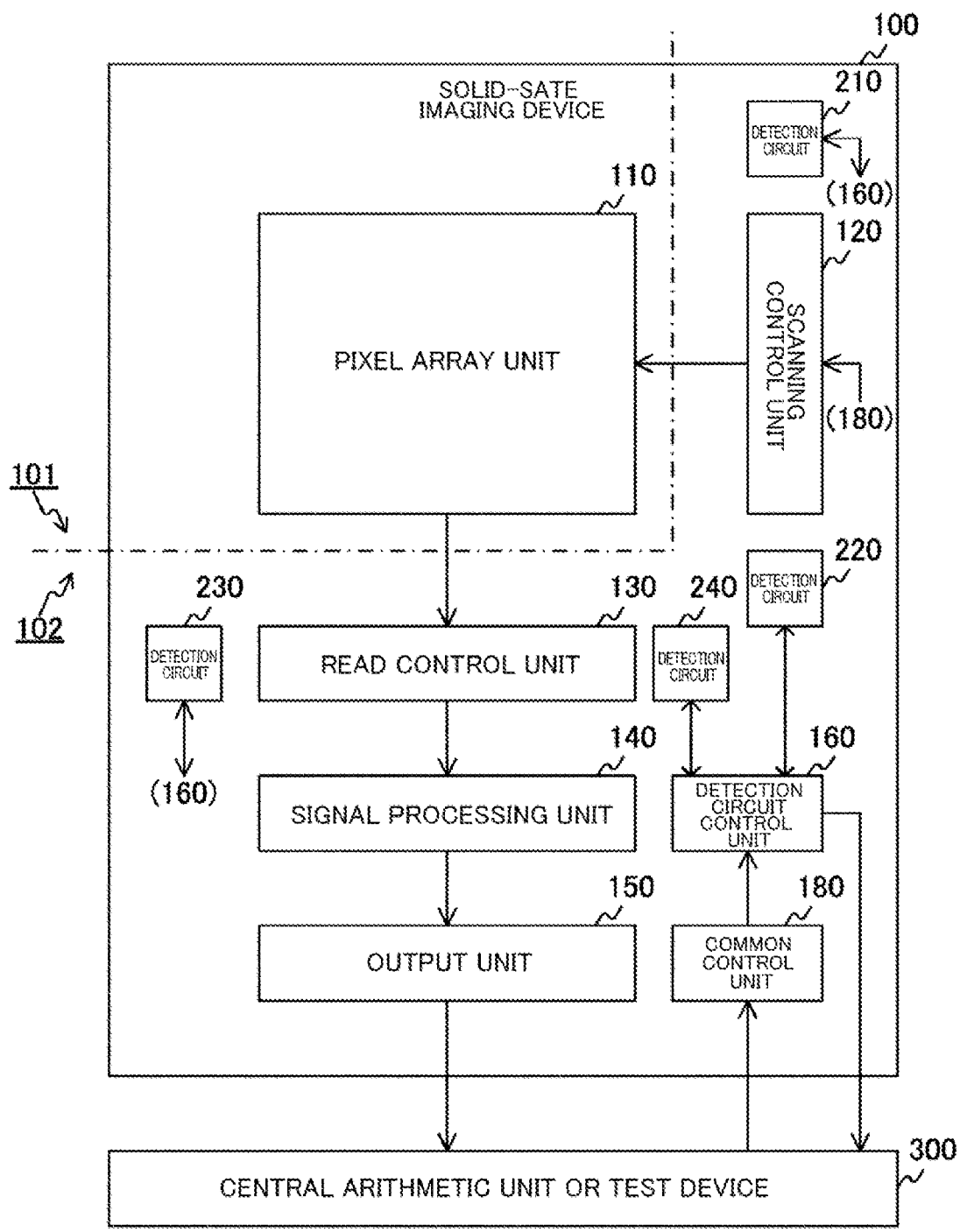
FIG. 1 is a block diagram showing an exemplary configuration of a test system according to a first embodiment of the present technology.

[Exemplary Configuration of Test System]
FIG. 1 is a block diagram showing an exemplary configuration of a test system according to an embodiment of the present technology. This test system is one for detecting the presence or absence of an abnormality or failure of a semiconductor device such as a solid-state imaging device and includes a solid-state imaging device 100 and a central arithmetic unit or a test device 300. The solid-state imaging device 100 includes a pixel array unit 110, a scanning control unit 120, a read control unit 130, a signal processing unit 140, an output unit 150, and a common control unit 180. The solid-state imaging device 100 also includes a plurality of detection circuits such as detection circuits 210, 220, 230 and 240 and a detection circuit control unit 160.

Circuits in the solid-state imaging device 100 are distributed and arranged on stacked semiconductor substrates 101 and 102. For example, the pixel array unit 110 is arranged on the semiconductor substrate 101 and the remaining circuits are arranged on the semiconductor substrate 102. The circuits arranged on the semiconductor substrates 101 and 102 are not limited to those with the configuration illustrated in FIG. 1. For example, the pixel array unit 110, the read control unit 130, and a comparator in the signal processing unit 140 may be arranged on the semiconductor substrate 101 and the remaining circuits may be arranged on the semiconductor substrate 102. While the two semiconductor substrates (101 and 102) are stacked here, three or more semiconductor substrates may be stacked and circuits of the solid-state imaging device 100 may be arranged on the three or more stacked substrates.

The semiconductor substrates 101 and 102 are joined by a plurality of connection lines wired across the semiconductor substrates 101 and 102. These connection lines are omitted in FIG. 1. The structure of the connection lines will be described later.

A plurality of pixels are arranged in the pixel array unit 110 in a two-dimensional grid pattern. Under the control of the common control unit 180, the scanning control unit 120 drives the rows of the pixel array unit 110 in order such that each row outputs pixel signals.

The read control unit 130 reads pixel signals from the columns of the pixel array unit and supplies the read pixel signals to the signal processing unit 140.

The signal processing unit 140 performs signal processing such as analog-to-digital (AD) conversion processing and correlated double sampling (CDS) processing on the pixel signals. The signal processing unit 140 supplies the processed pixel signals to the output unit 150.

The output unit 150 outputs image data in which the pixel signals are arranged to the central arithmetic unit or the test device 300.

The detection circuit 210 detects the presence or absence of an abnormality in a joint surface between the semiconductor substrates 101 and 102 based on the conductive state of a connection line under the control of the detection circuit control unit 160. An abnormality detection target location of the detection circuit 210 is the wiring location of the connection line. One of the semiconductor substrates 101 and 102 being peeled off from the other or the position thereof being displaced after the semiconductor substrates are bonded together, causing a connection failure between semiconductor substrates, will be assumed as an abnormality of the joint surface. Other abnormalities of the joint surface that will be assumed include two points which have to be insulated from each other becoming conductive (that is, being short-circuited) on the joint surface before the semiconductor substrates 101 and 102 are bonded together. The detection circuit 210 supplies a detection signal indicating the detection result to the detection circuit control unit 160.

Peeling or short-circuiting of the joint surface can also be treated as a failure rather than an abnormality. However, such peeling or short-circuiting will hereinafter be treated as an abnormality for the purpose of distinguishing from a failure that occurs in circuits other than the joint surface.

The functions of the detection circuits 220, 230 and 240 are the same as those of the detection circuit 210, except that their abnormality detection target locations (that is, the wiring locations of connection lines) differ from that of the detection circuit 210. The detection target locations of these detection circuits are arbitrary.

The common control unit 180 controls each circuit in the solid-state imaging device 100. The common control unit 180 controls the operation timing of the scanning control unit 120 and the signal processing unit 140, for example, in synchronization with a vertical synchronization signal from the central arithmetic unit or the test device 300. The common control unit 180 also supplies a mode signal from the central arithmetic unit or the test device 300 to the detection circuit control unit 160. Details of the mode signal will be described later.

The detection circuit control unit 160 controls the operation of the detection circuit 210 and the like based on the mode signal. The detection circuit control unit 160 also aggregates detection signals of the plurality of detection circuits such as the detection circuit 210 and supplies the aggregated signal to the central arithmetic unit or the test device 300 as an output signal.

The central arithmetic unit or the test device 300 detects the presence or absence of an abnormality or failure of the solid-state imaging device 100 based on the output signal from the detection circuit control unit 160. The central arithmetic unit or the test device 300 assumes, for example, an abnormality (such as peeling) of the joint surface of the semiconductor substrates 101 and 102 as an abnormality of the solid-state imaging device 100. The central arithmetic unit or the test device 300 also assumes, for example, a failure of a detection circuit such as the detection circuit 210 as a failure of the solid-state imaging device 100. The central arithmetic unit or the test device 300 is an example of a detection unit described in the claims.

The central arithmetic unit or the test device 300 can also detect the presence or absence of a failure of a circuit other than the detection circuit 210 such as a pixel in the pixel array unit 110 by using the image data.

Although the detection circuits such as the detection circuit 210 and the detection circuit control unit 160 are provided in the solid-state imaging device 100, these circuits can also be arranged in a semiconductor device other than the solid-state imaging device 100. The solid-state imaging device 100 is an example of a semiconductor device described in the claims.

Figure 2:
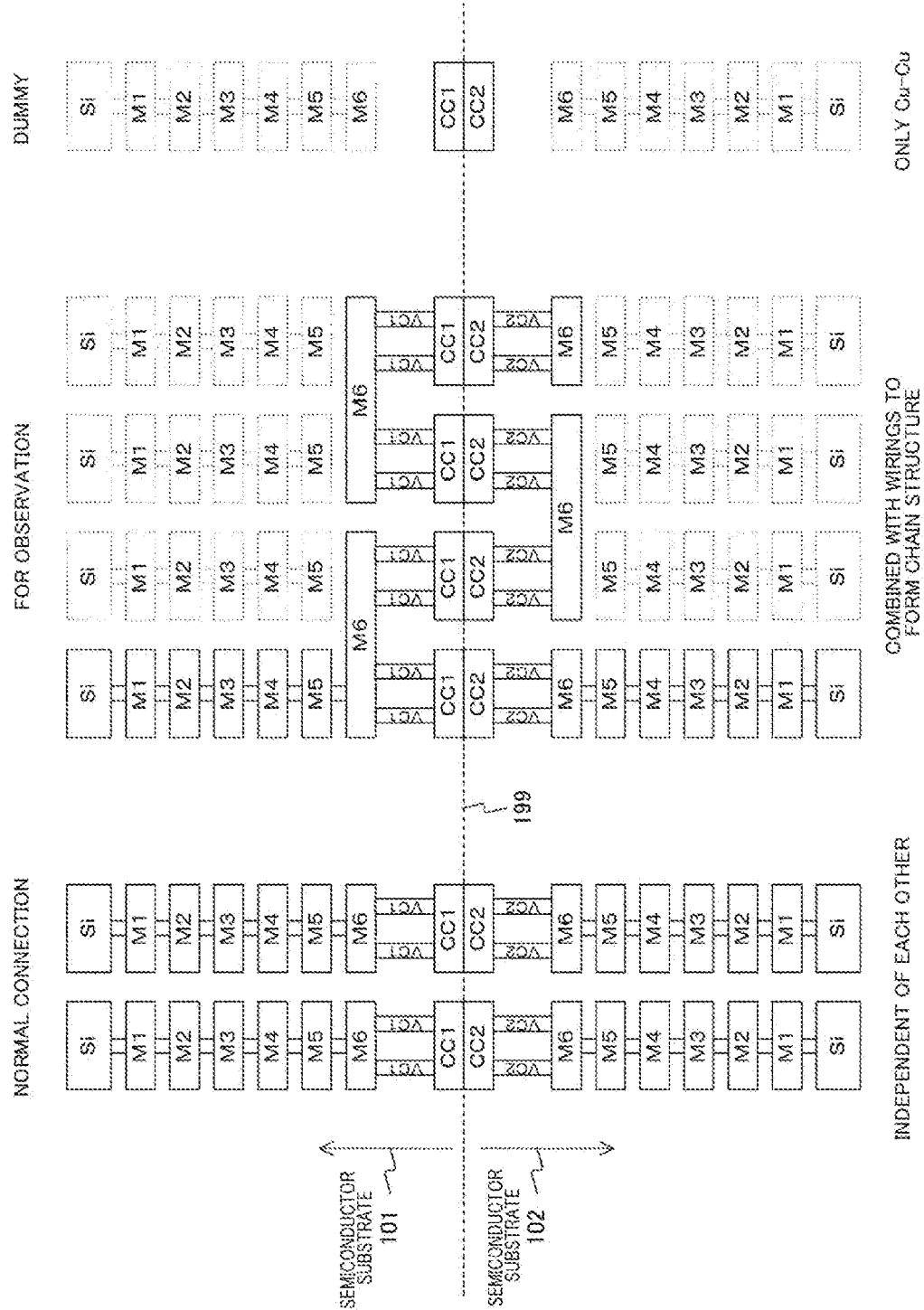
FIGS. 2A, 2B, and 2C are diagrams showing examples of the relationship between copper wirings and metal wiring layers of a solid-state imaging device according to an embodiment of the present technology.

FIGS. 2A, 2B, and 2C are diagrams showing examples of the relationship between copper wirings and metal wiring layers of the semiconductor device according to an embodiment of the present technology.

Examples in which the semiconductor substrate 101 and the second semiconductor substrate 102 are bonded together with a joint surface 199 therebetween are shown here. Six metal wiring layers in each of the semiconductor substrate 101 and the second semiconductor substrate 102 are assumed as an example and denoted by M1 to M6 in order from a silicon (Si) layer.

Further, the copper wirings of the semiconductor substrate 101 and the second semiconductor substrate 102 are brought into contact with each other and electrically connected. The copper wirings of the semiconductor substrate 101 are denoted by CC1 and the copper wirings of the semiconductor substrate 102 are denoted by CC2. Vertical connections between the copper wirings CC1 and the metal wiring layer M6 on the semiconductor substrate 101 are denoted by VC1 and vertical connections between the copper wirings CC2 and the metal wiring layer M6 on the semiconductor substrate 102 are denoted by VC2.

FIG. 2A shows an example in which copper wirings CC1 and CC2 are used for normal connection between the semiconductor substrate 101 and the second semiconductor substrate 102. In this example, different copper wirings CC1 and CC2 connect the semiconductor substrate 101 and the second semiconductor substrate 102 independently of each other.

FIG. 2B shows that the copper wirings CC1 and CC2 that connect the semiconductor substrate 101 and the second semiconductor substrate 102 and the metal wiring layers M6 are combined to form a chain structure. Such a chained connection is called a daisy chain.

FIG. 2C shows copper wirings CC1 and CC2 that connect the semiconductor substrate 101 and the second semiconductor substrate 102, in which case the copper wirings CC1 and CC2 are not connected to the metal wiring layers and do not have the function of transmitting circuit signals. These copper wirings CC1 and CC2 correspond to the dummy wirings described above and are mainly used to ensure flatness.

Figure 3:
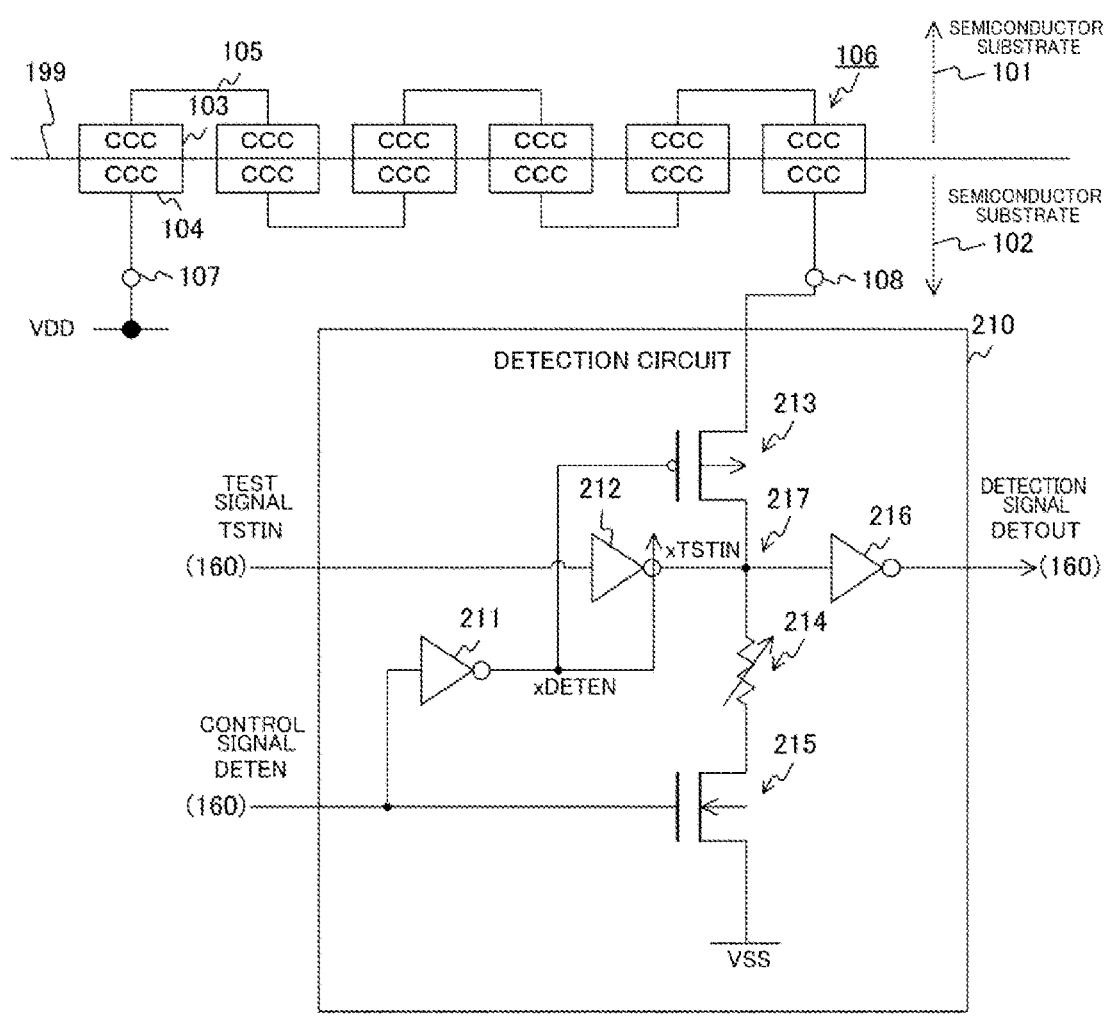
FIG. 3 is a diagram showing a structure of a connection line after bonding and exemplary circuitry of a detection circuit according to the first embodiment of the present technology.

FIG. 3 is a diagram showing a structure of a connection line after bonding and exemplary circuitry of the detection circuit 210 according to the first embodiment of the present technology. CCC in FIG. 3 indicates a Cu-Cu connection. In the semiconductor substrate 101, a plurality of copper wirings 103 are provided on the joint surface 199. On the other hand, in the semiconductor substrate 102, a copper wiring 104 is provided on the joint surface 199 for each copper wiring 103. A copper wiring 103 is electrically connected to a corresponding copper wiring 104. Pairs of copper wirings 103 and 104 are connected in a daisy chain through a plurality of metal wirings 105 as illustrated in FIG. 2B. A single signal line 106 formed through the copper wirings 103 and 104 and the metal wirings 105 is hereinafter referred to as a "connection line." One of the two ends of the connection line 106 will be referred to as a terminal 107 and the other will be referred to as a terminal 108. A Cu-Cu connection is, for example, a structure in which at least a part of a copper wiring 103 of the semiconductor substrate 101 and at least a part of a copper wiring 104 of the semiconductor substrate 102 are directly bonded together such that the semiconductor substrates 101 and 102 can be connected. Examples of Cu-Cu connections include, but are not limited to, those of the copper wirings 103 and 104.

For example, wirings made of a conductive material such as a metal are directly joined to each other to connect the wirings. This can connect the semiconductor substrates 101 and 102. Further, a desired electrical connection can also be established via this Cu-Cu connection.

A power source with a power source voltage VDD is connected to the terminal 107. On the other hand, the detection circuit 210 is connected to the terminal 108. Connecting the power source allows the connection line 106 to be used as a power source line. Adopting a daisy chain structure and connecting a plurality of pieces of metals (such as the copper wirings 103) as illustrated in FIG. 3 allows a wide range to become a detection target. For example, a configuration in which the semiconductor substrates 101 and 102 can be electrically connected via copper wirings 103 and 104 and a plurality of metal wirings 105 is possible.

Inverters 211, 212, and 216 are arranged in the detection circuit 210. A p-channel metal oxide semiconductor (pMOS) transistor 213, a variable resistor 214, and an n-channel MOS (nMOS) transistor 215 are arranged in the detection circuit 210.

The resistance of the variable resistor 214 is set by a set value that is held in a register or the like. A device external to the solid-state imaging device 100 can change the resistance of the variable resistor 214 by controlling the set value thereof. A resistor with a fixed resistance may be provided instead of the variable resistor 214.

The variable resistor 214 is an example of a resistor described in the claims.

The pMOS transistor 213 is inserted between one end of the variable resistor 214 and the terminal 108 and the nMOS transistor 215 is inserted between the other end of the variable resistor 214 and a reference terminal of a predetermined reference potential (such as ground potential) VSS. A control signal DETEN from the detection circuit control unit 160 is input to a gate of the nMOS transistor 215. Here, the control signal DETEN is a signal for enabling or disabling the detection operation of the detection circuit 210. For example, a high level control signal DETEN is supplied when the detection operation is to be enabled and a low level control signal DETEN is supplied when the detection operation is to be disabled.

The inverter 211 inverts the control signal DETEN from the detection circuit control unit 160. The inverter 211 supplies a signal obtained by inverting the control signal DETEN to the inverter 212 and a gate of the pMOS transistor 213 as an inverted signal xDETEN.

The inverter 212 inverts a test signal TSTIN from the detection circuit control unit 160 when the inverted signal xDETEN is at a high level (that is, in the disabled case). The inverter 212 supplies the inverted signal to a connection node 217 between the pMOS transistor 213 and the variable resistor 214 as an inverted signal xTSTIN. On the other hand, the output of the inverter 212 becomes high impedance when the inverted signal xDETEN is at a low level (that is, in the enabled case).

The inverter 216 inverts the potential of the connection node 217. The inverter 216 supplies the inverted signal to the detection circuit control unit 160 as a detection signal DETOUT.

According to the above configuration, when enable has been set, the pMOS transistor 213 on the power source side is turned on and the terminal 108 of the connection line 106 and one end of the variable resistor 214 are connected. The nMOS transistor 215 on the ground side is also turned on and the other end of the variable resistor 214 and the reference terminal are connected.

Then, if the semiconductor substrates 101 and 102 are not peeled off when enable has been set, a current from the power source flows through the connection line 106 and the connection line 106 becomes conductive. Because the pMOS transistor 213 and the nMOS transistor 215 are in an on state, a current also flows through the variable resistor 214 and a potential corresponding to the resistance of the variable resistor 214 is generated at the connection node 217. It is assumed that, letting Th be a threshold value of the input signal required to invert the output of the inverter 216 from a high level to a low level, the variable resistor 214 has been set to a resistance at which the potential when the connection line 106 is conductive becomes higher than the threshold value Th. With this setting, a low level detection signal DETOUT is output when the connection line 106 is conductive. Making the resistance variable in this way allows the external device to adjust the resistance of the variable resistor 214 according to the threshold value of the inverter 216.

Here, the case where one of the semiconductor substrates 101 and 102 is peeled off or the position thereof is displaced when enable has been set will be considered. In this case, the connection line 106 becomes non-conductive, no current flows through the variable resistor 214, and the potential of the connection node 217 drops to a low level. Therefore, a high level detection signal DETOUT is output from the inverter 216. That is, the high level detection signal DETOUT indicates that peeling or position displacement has occurred.

Thus, when enable has been set, the detection circuit 210 can detect the presence or absence of an abnormality in the joint surface 199 based on the energization state of the connection line 106 wired across the semiconductor substrates 101 and 102. The detection circuit 210 can detect the presence or absence of an abnormality in the joint surface at any location. For example, even when the connection line 106 is wired in an area other than the pixel array unit 110 as a power source line, it is possible to detect the presence or absence of an abnormality in that area by connecting the detection circuit 210 to the connection line 106. Because the wiring location of the connection line 106 (a power source line) is not limited to the pixel array unit 110 in this way, the degree of freedom of the abnormality detection target location can be improved.

On the other hand, when disable has been set, the inverter 212 inverts the test signal TSTIN and supplies it to the connection node 217. In the disabled case, the pMOS transistor 213 and the nMOS transistor 215 are turned off. Therefore, the node potential of the connection node 217 is determined by the output of the inverter 212 regardless of whether the connection line 106 is conductive or not. The inverter 216 inverts the potential of the connection node 217 (that is, the output of the inverter 212) and outputs the inverted potential as a detection signal DETOUT.

Thus, if there is no failure in the detection circuit 210 when disable has been set, the inverters 212 and 216 output a signal with the same logical value as the test signal TSTIN as a detection signal DETOUT. However, if the detection circuit 210 fails, the logical values of the test signal TSTIN and the detection signal DETOUT do not match. Therefore, the central arithmetic unit or the test device 300 can detect the presence or absence of a failure in the detection circuit 210 based on the detection signal DETOUT.

Although the inverter 212 is arranged on the input side of the connection node 217, a logic gate (such as a buffer) other than an inverter can be arranged instead of the inverter 212. The inverter 212 is an example of an input-side logic gate described in the claims. Although the inverter 216 is arranged on the output side of the connection node 217, a logic gate (such as a buffer) other than an inverter can also be arranged instead of the inverter 216. The inverter 216 is an example of an output-side logic gate described in the claims.

The circuit configuration of the detection circuit 230 is the same as that of the detection circuit 210. Also for the detection circuit 230, a connection line different from the connection line 106 is wired and the detection circuit 230 takes the wiring location of the connection line as a detection target. Providing daisy chains at a plurality of locations in this way can improve analysis performance.

Although a Cu—Cu connection in which copper wirings are contacted and connected to each other is taken as a detection target, a connection between the substrates other than a Cu—Cu connection can also be taken as a detection target. For example, the detection circuit 210 or the like can be connected to a through-silicon via (TSV) and the TSV can be taken as a detection target.

Although the detection circuit 210 and the like are provided on the lower semiconductor substrate 102 with the semiconductor substrate 101 on the upper side, the detection circuits can also be arranged on the upper semiconductor substrate 101.

FIG. 4 is a diagram showing an example of a truth table of the inverter 212 according to the first embodiment of the present technology. When the inverted signal xDETEN is at a low level (that is, in the enabled case), the output (xTSTIN) of the inverter 212 becomes high impedance (HiZ) regardless of the value of the test signal TSTIN.

On the other hand, when the inverted signal xDETEN is at a high level (that is, in the disabled case), the inverter 212 inverts the test signal TSTIN and outputs the inverted signal as xTSTIN.

Figure 5:
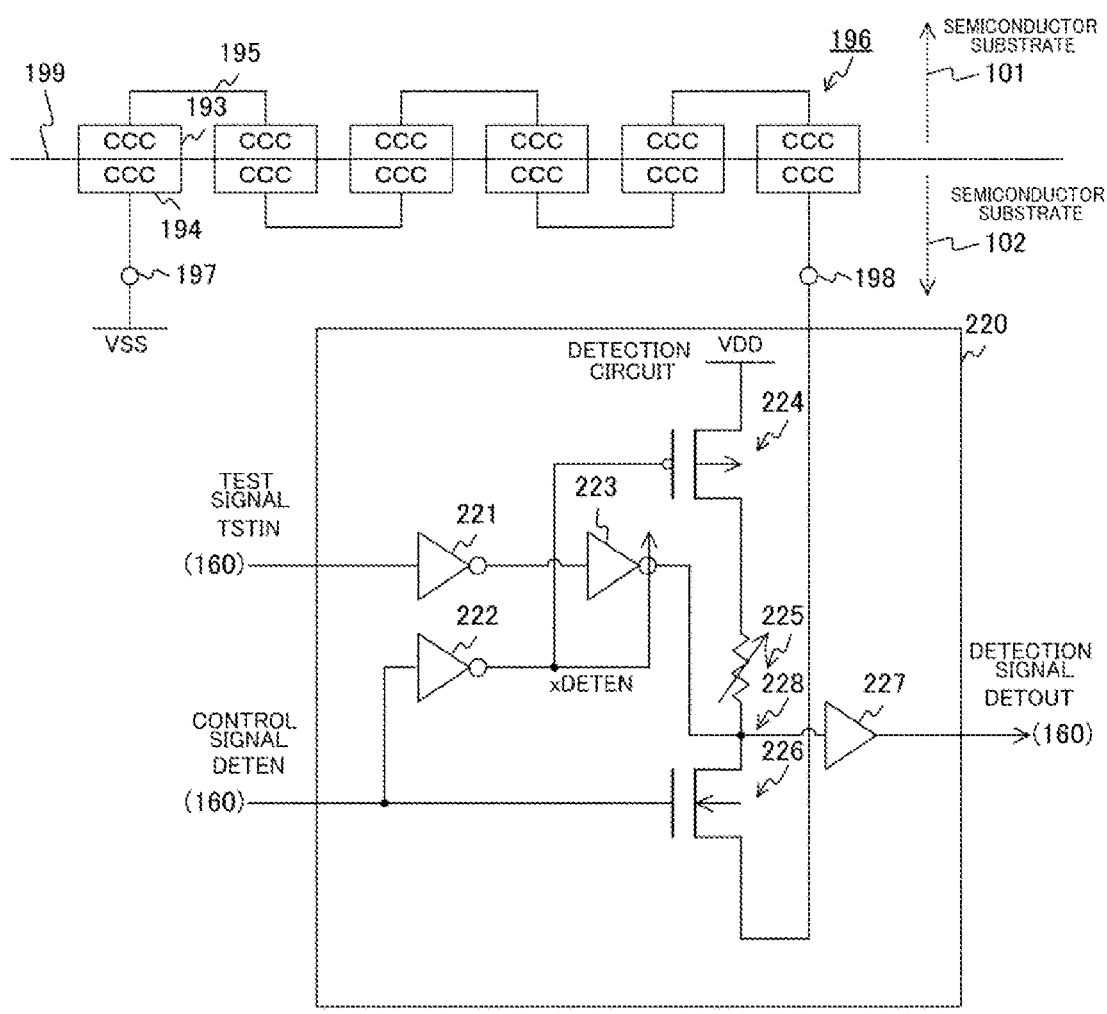
FIG. 5 is a diagram showing a structure of a connection line after bonding and exemplary circuitry of another detection circuit according to the first embodiment of the present technology.

FIG. 5 is a diagram showing a structure of a connection line after bonding and exemplary circuitry of another detection circuit 220 according to the first embodiment of the present technology. CCC in FIG. 5 indicates a Cu—Cu connection.

On the joint surface 199, a plurality of copper wirings 193 are provided on the semiconductor substrate 101 side and a copper wiring 194 is provided on the semiconductor substrate 102 side for each copper wiring 193. Pairs of copper wirings 193 and 194 are connected in a daisy chain through a plurality of metal wirings 195. A single signal line formed through the copper wirings 193 and 194 and the metal wirings 195 will be referred to as a connection line 196 and both ends of the connection line 196 will be referred to as terminals 197 and 198.

A reference terminal of a reference potential VSS (such as ground potential) is connected to the terminal 197 and the detection circuit 220 is connected to the terminal 198. Connecting the ground potential allows the connection line 196 to be used as a ground line. The detection circuit 220 includes inverters 221 to 223, a pMOS transistor 224, a variable resistor 225, an nMOS transistor 226, and a buffer 227.

The pMOS transistor 224 is inserted between a power source terminal and one end of the variable resistor 225 and the nMOS transistor 226 is inserted between the other end of the variable resistor 225 and the terminal 198. A control signal DETEN is input to a gate of the nMOS transistor 226.

The inverter 221 inverts a test signal TSTIN and outputs the inverted signal to the inverter 223. The inverter 222 inverts the control signal DETEN and outputs the inverted signal to the inverter 223 and a gate of the pMOS transistor 224 as xDETEN.

The inverter 223 inverts the output signal of the inverter 221 when the inverted signal xDETEN is at a high level (that is, in the disabled case). The inverter 223 supplies the inverted signal to a connection node 228 between the nMOS transistor 226 and the variable resistor 225. On the other hand, the output of the inverter 223 becomes high impedance when the inverted signal xDETEN is at a low level (that is, in the enabled case).

The buffer 227 outputs a signal of the potential of the connection node 228 to the detection circuit control unit 160 as a detection signal DETOUT.

According to the above configuration, similar to the detection circuit 210, the detection circuit 220 can detect the presence or absence of an abnormality in the joint surface based on the energization state of the connection line 196 connected to the reference terminal.

The variable resistor 225 is an example of the resistor described in the claims. The inverters 221 and 223 are examples of the input-side logic gate described in the claims and the buffer 227 is an example of the output-side logic gate described in the claims.

The circuit configuration of the detection circuit 240 is the same as that of the detection circuit 220.

Although both the detection circuit 210 whose detection target is the connection line 106 (the power source line) connected to the power source and the detection circuit 220 whose detection target is the connection line 196 (the ground line) connected to the ground potential are arranged, only one of the detection circuits 210 and 220 can also be arranged.

In FIGS. 3 and 5 described above, the detection circuits 210 and 220 are used to detect an abnormality in the joint surface after bonding of the semiconductor substrates 101 and 102. However, the detection circuits 210 and 220 can also be used to detect an abnormality in the joint surface before bonding.

Figure 6:
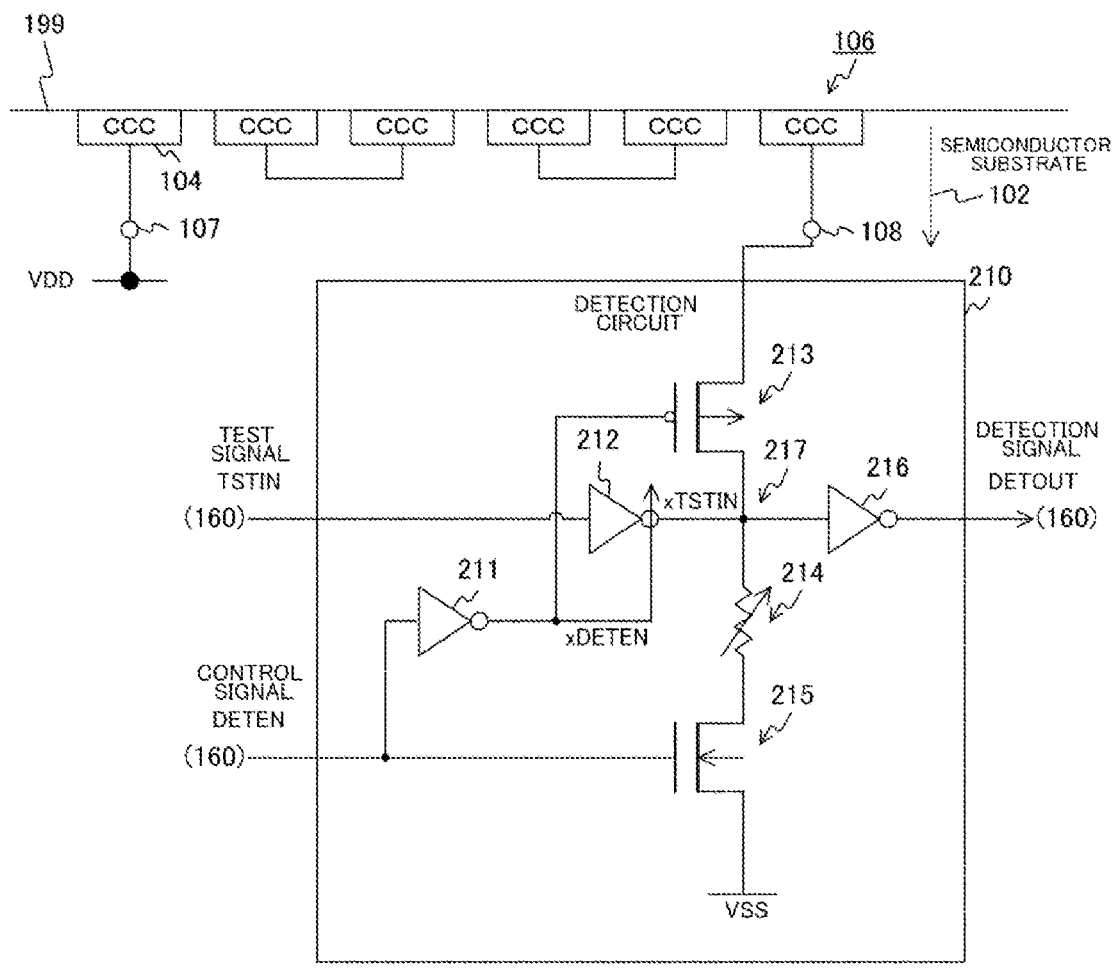
FIG. 6 is a diagram showing a structure of a connection line before bonding and exemplary circuitry of a detection circuit according to the first embodiment of the present technology.

FIG. 6 is a diagram showing a structure of the connection line 106 before bonding and exemplary circuitry of the detection circuit 210 according to the first embodiment of the present technology. CCC in FIG. 6 indicates a Cu—Cu connection. Before the bonding, copper wirings and metal wirings on the semiconductor substrate 101 side are not electrically connected, such that the connection line 106 becomes non-conductive. Therefore, when enable has been set, no current flows through the variable resistor 214 and a high level detection signal DETOUT is output from the inverter 216.

Here, the case where a short circuit has occurred at the joint surface of the semiconductor substrate 101 when enable has been set. In this case, the connection line 106 becomes conductive, a current flows through the variable resistor 214, and a low level detection signal DETOUT is output from the inverter 216. That is, the low level detection signal DETOUT indicates that a short circuit has occurred.

Figure 7:
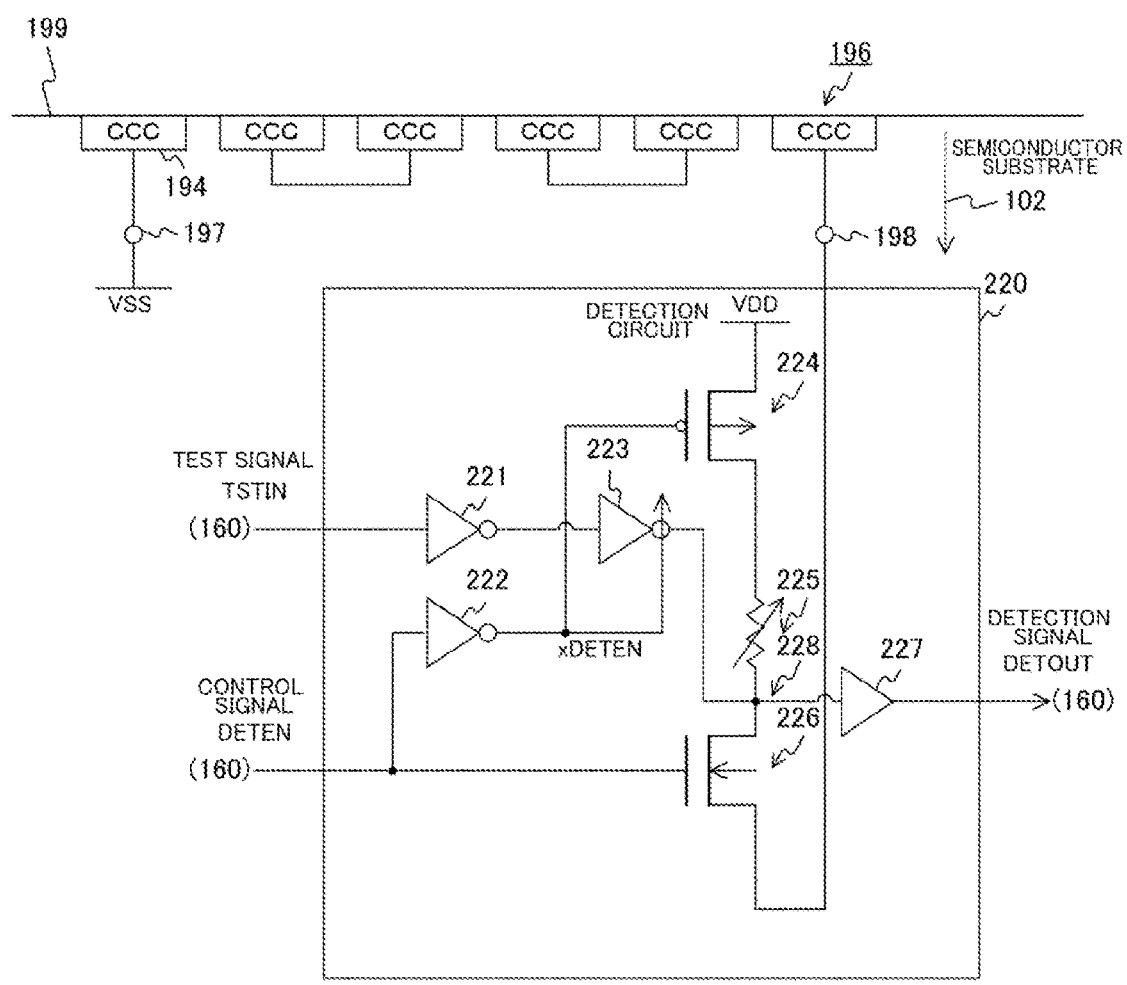
FIG. 7 is a diagram showing a structure of a connection line before bonding and exemplary circuitry of another detection circuit according to the first embodiment of the present technology.

FIG. 7 is a diagram showing a structure of the connection line 196 before bonding and exemplary circuitry of another detection circuit 220 according to the first embodiment of the present technology. CCC in FIG. 7 indicates a Cu—Cu connection. In the detection circuit 220, a low level detection signal DETOUT is also output if a short circuit occurs at the joint surface of the semiconductor substrate 101 when enable has been set.

Here, it is assumed that either an abnormality detection mode or a test passage check mode has been set in a detection circuit such as the detection circuit 210 by a mode signal. The abnormality detection mode is a mode for detecting the presence or absence of an abnormality in the joint surface and the test passage check mode is a mode for passing a test signal through the detection circuit.

FIG. 8 is a diagram showing an example of an operation of the detection circuit 210 in the abnormality detection mode according to the first embodiment of the present technology. In the abnormality detection mode, a high level control signal DETEN (that is, an enable control signal) is input.

The detection circuit 210 outputs a high level detection signal DETOUT when the connection line 106 is not conductive and outputs a low level detection signal DETOUT when the connection line 106 is conductive. Before bonding, the low level detection signal DETOUT indicates that there is an abnormality in the joint surface due to a short circuit.

On the other hand, after bonding, the high level detection signal DETOUT indicates that there is an abnormality in the joint surface due to peeling or position displacement.

FIG. 9 is a diagram showing an example of an operation of the detection circuit in the test passage check mode according to the first embodiment of the present technology. In the test passage check mode, a low level control signal DETEN (that is, a disable control signal) is input.

For example, after bonding, a high level test signal TSTIN is input as a pseudo failure. Before bonding, a low level test signal TSTIN is input as a pseudo failure.

Then, when both the test signal TSTIN and the detection signal DETOUT are at a high level or when both are at a low level, the central arithmetic unit or the test device 300 determines that there is no failure in the detection circuit 210. On the other hand, when one of the test signal TSTIN and the detection signal DETOUT is at a high level and the other is at a low level, the central arithmetic unit or the test device 300 determines that there is a failure in the detection circuit 210.

The operations of the detection circuits 220, 230 and 240 are the same as the operation of the detection circuits 210 illustrated in FIGS. 8 and 9.

Figure 10:
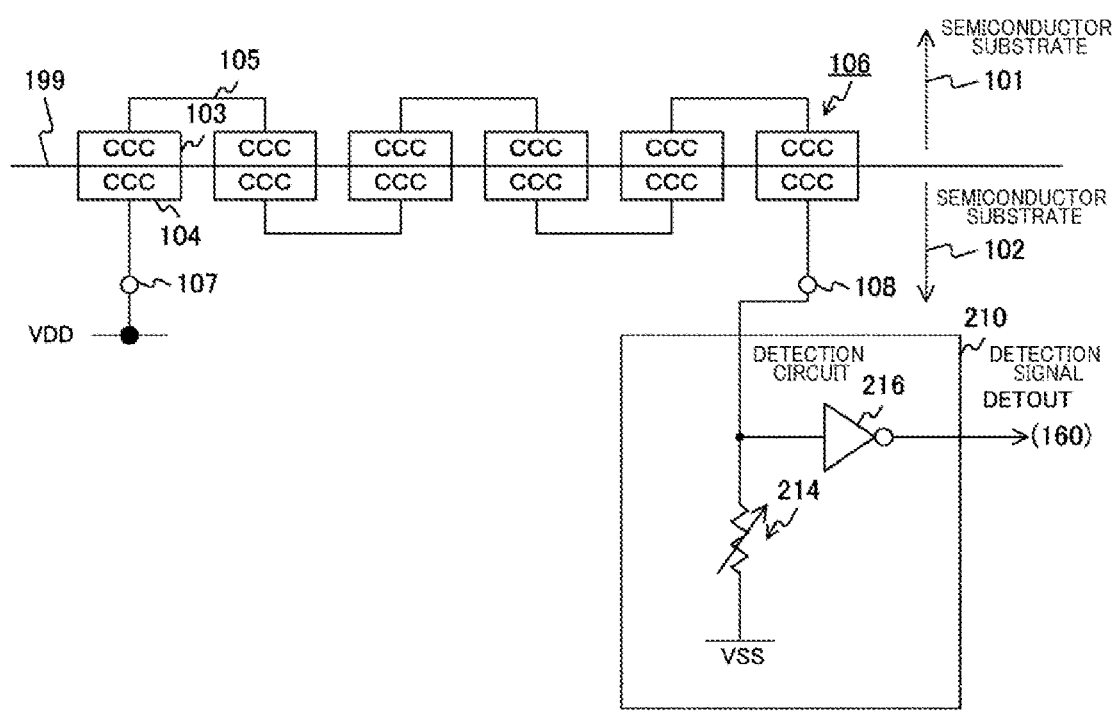
FIG. 10 is a diagram showing exemplary circuitry of a detection circuit according to the first embodiment of the present technology in the case where no test signal is input and enable setting is not performed.

Further, when no test signal is input and enable setting is not performed, only the variable resistor 214 and the inverter 216 can be arranged in the detection circuit 210 and the other elements can be eliminated as illustrated in FIG. 10.

Figure 11:
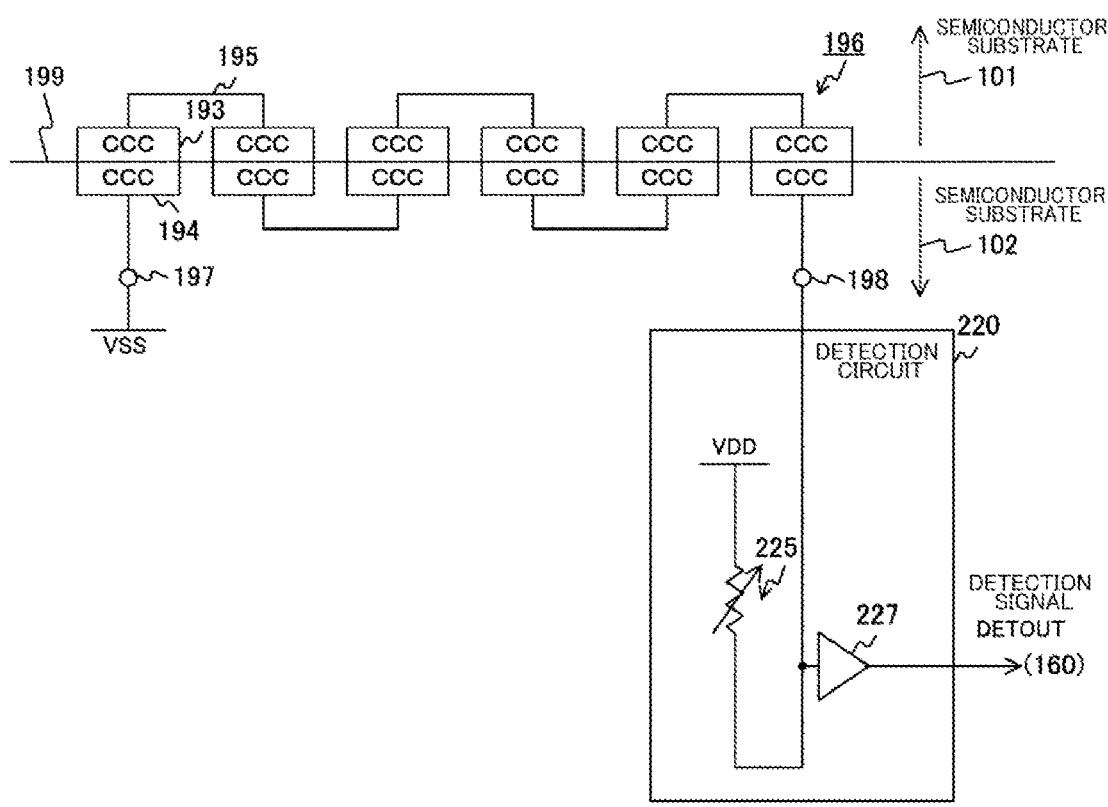
FIG. 11 is a diagram showing another example of a detection circuit according to the first embodiment of the present technology in the case where no test signal is input and enable setting is not performed.

Similarly, only the variable resistor 225 and the buffer 227 can be arranged in the detection circuit 220 and the other elements can be eliminated as illustrated in FIG. 11.

Figure 12:
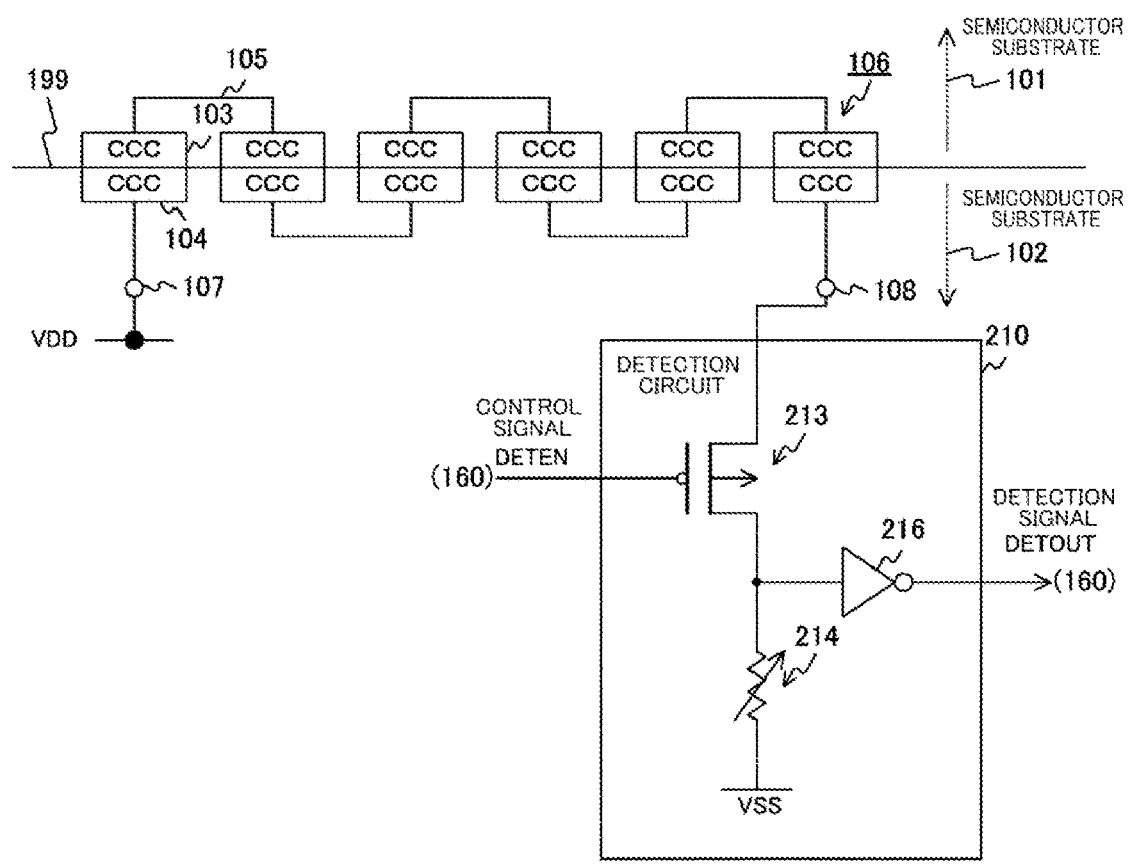
FIG. 12 is a diagram showing exemplary circuitry of a detection circuit in which a transistor is eliminated according to the first embodiment of the present technology.
Figure 13:
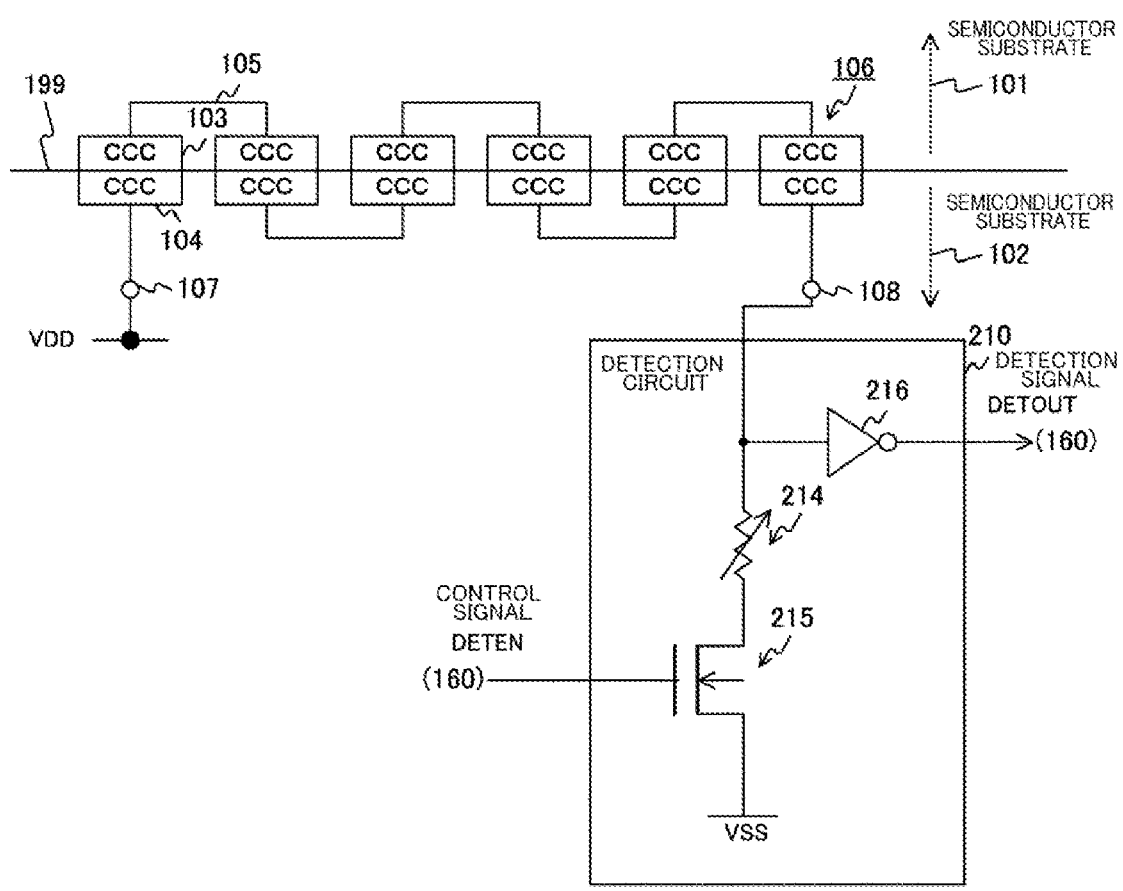
FIG. 13 is a diagram showing exemplary circuitry of a detection circuit in which a transistor is eliminated according to the first embodiment of the present technology.

When enable setting is further performed, it is necessary to add transistors to the detection circuit 210 illustrated in FIG. 10 and the positions and number of transistors to be added are arbitrary. For example, only a pMOS transistor 213 can be added as illustrated in FIG. 12. Alternatively, only an nMOS transistor 215 can be added as illustrated in FIG. 13. Alternatively, a pMOS transistor 213 for enable setting can be inserted between a power source and a terminal 107 as illustrated in FIG. 14.

Figure 14:
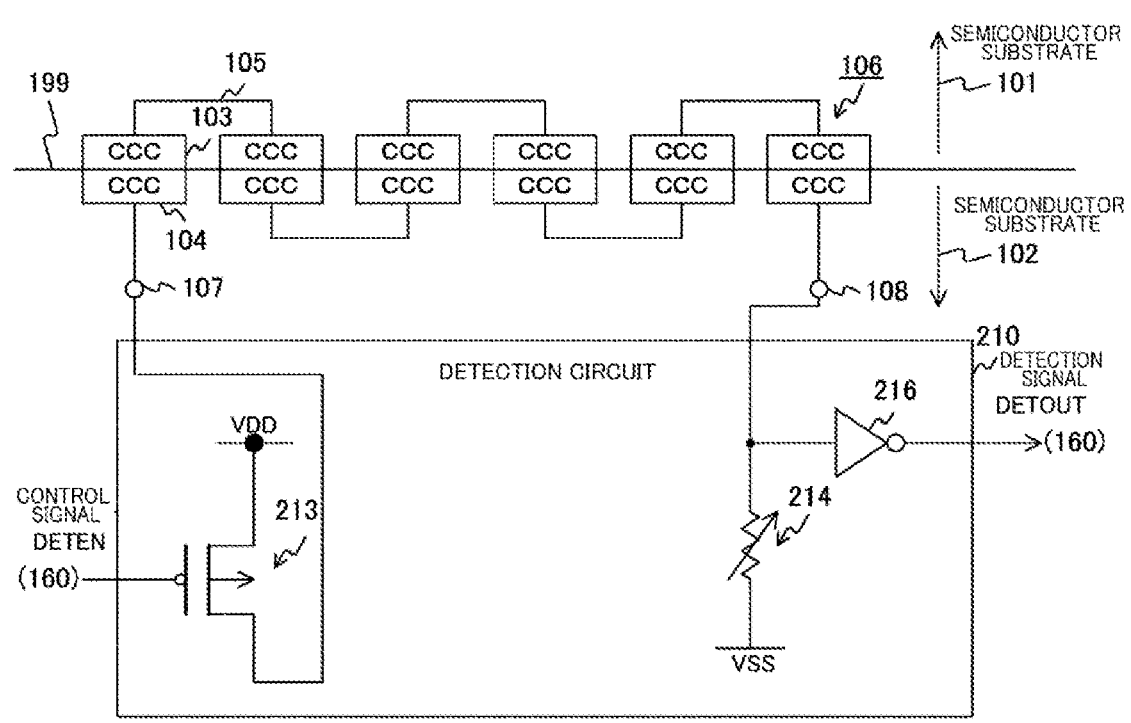
FIG. 14 is a diagram showing exemplary circuitry of a detection circuit in which the arrangement of transistors is changed and a transistor is eliminated according to the first embodiment of the present technology.

As illustrated in FIGS. 12 to 14, a transistor for enablement is inserted in at least one of the path between the power source and the terminal 107, the path between the terminal 108 and the variable resistor 214, and the path between the variable resistor 214 and the reference potential VSS. These transistors may be either a pMOS transistor or an nMOS transistor. Similarly, in the case of the detection circuit 220, a transistor for enablement is inserted in at least one of the path between the reference potential VSS and the terminal 197, the path between the power source and the variable resistor 214, and the path between the variable resistor 214 and the terminal 198

[Exemplary Configuration of Detection Circuit Control Unit]

Figure 15:
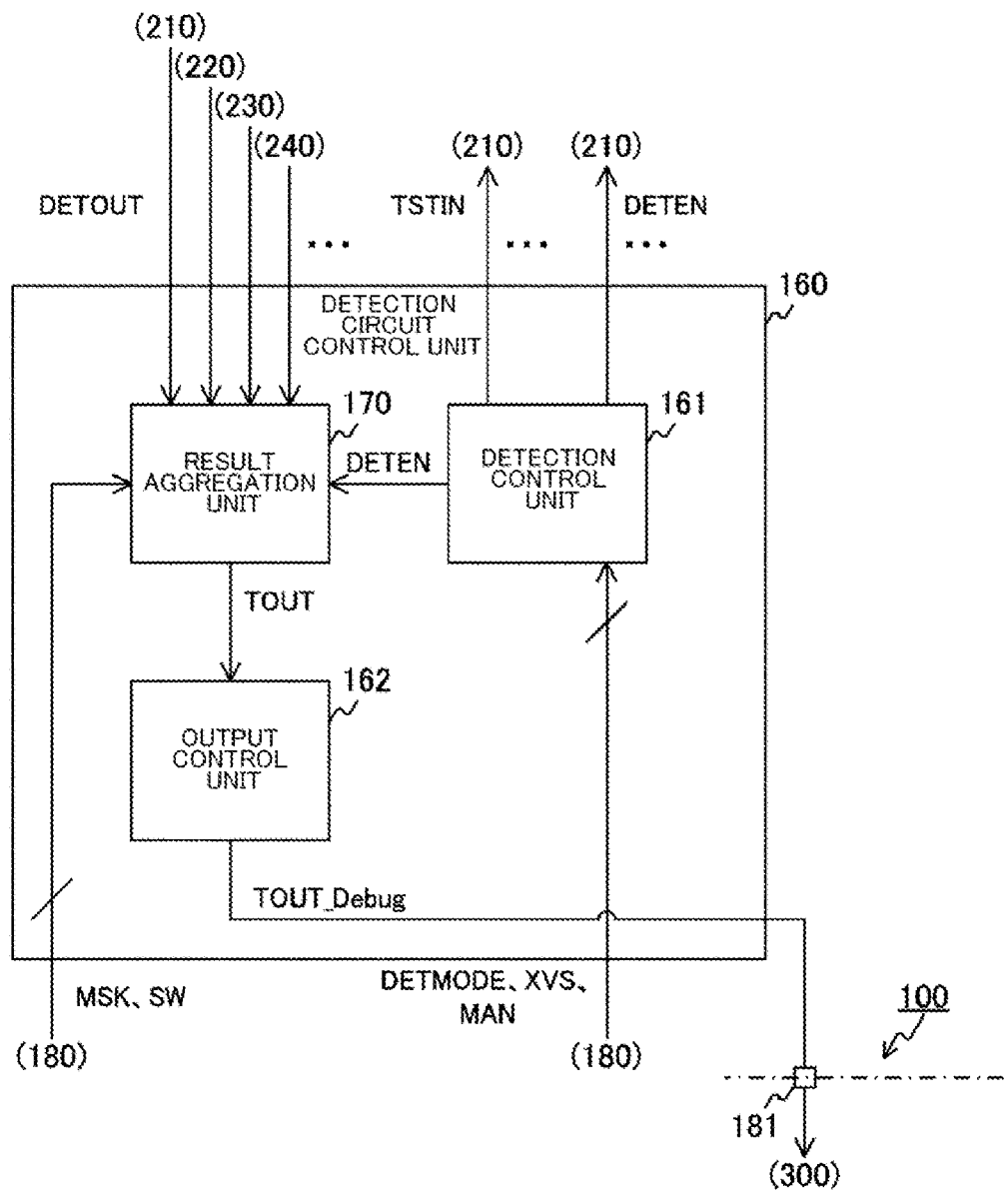
FIG. 15 is a block diagram showing an exemplary configuration of a detection circuit control unit according to the first embodiment of the present technology.

FIG. 15 is a block diagram showing an exemplary configuration of the detection circuit control unit 160 according to the first embodiment of the present technology. The detection circuit control unit 160 includes a result aggregation unit 170, a detection control unit 161, and an output control unit 162.

The result aggregation unit 170 aggregates detection signals DETOUT of the plurality of detection circuits such as the detection circuit 210 to generate an output signal TOUT. The result aggregation unit 170 outputs the output signal TOUT to the output control unit 162.

The detection control unit 161 controls each detection circuit such as the detection circuit 210 based on a mode signal DETMODE, a vertical synchronization signal XVS, and an operation signal MAN from the common control unit 180. Here, the mode signal DETMODE is a signal for setting each of the mode of the detection circuit and the mode of the detection circuit control unit 160. The mode of the detection circuit is set to either the abnormality detection mode or the test passage check mode described above. The mode of the detection circuit control unit 160 is set to either a manual mode or an autorun mode.

The detection circuit control unit 161 generates a test signal TSTIN and an enable signal DETEN and supplies them to the detection circuits such as the detection circuit 210. The control signal DETEN is supplied not only to the detection circuits but also to the result aggregation unit 170.

Here, the manual mode is a mode in which the enable control signal DETEN is generated and supplied according to the user operation. On the other hand, the autorun mode is a mode in which an enable control signal DETEN is generated in synchronization with the vertical synchronization signal XVS while the enable control signal DETEN is generated according to a user operation.

The operation signal MAN is a signal that the central arithmetic unit or the test device 300 generates in response to a user operation. This operation signal MAN is transmitted, for example, via an interface of the inter-integrated circuit (I2C) standard. The detection control unit 161 generates an enable control signal DETEN when the operation signal MAN has been input.

The output control unit 162 changes the polarity and output period of the output signal TOUT as necessary and outputs the resulting signal to the central arithmetic unit or the test device 300 as an output signal TOUT_Debug via an output terminal 181.

[Exemplary Configuration of Result Aggregation Unit]

Figure 16:
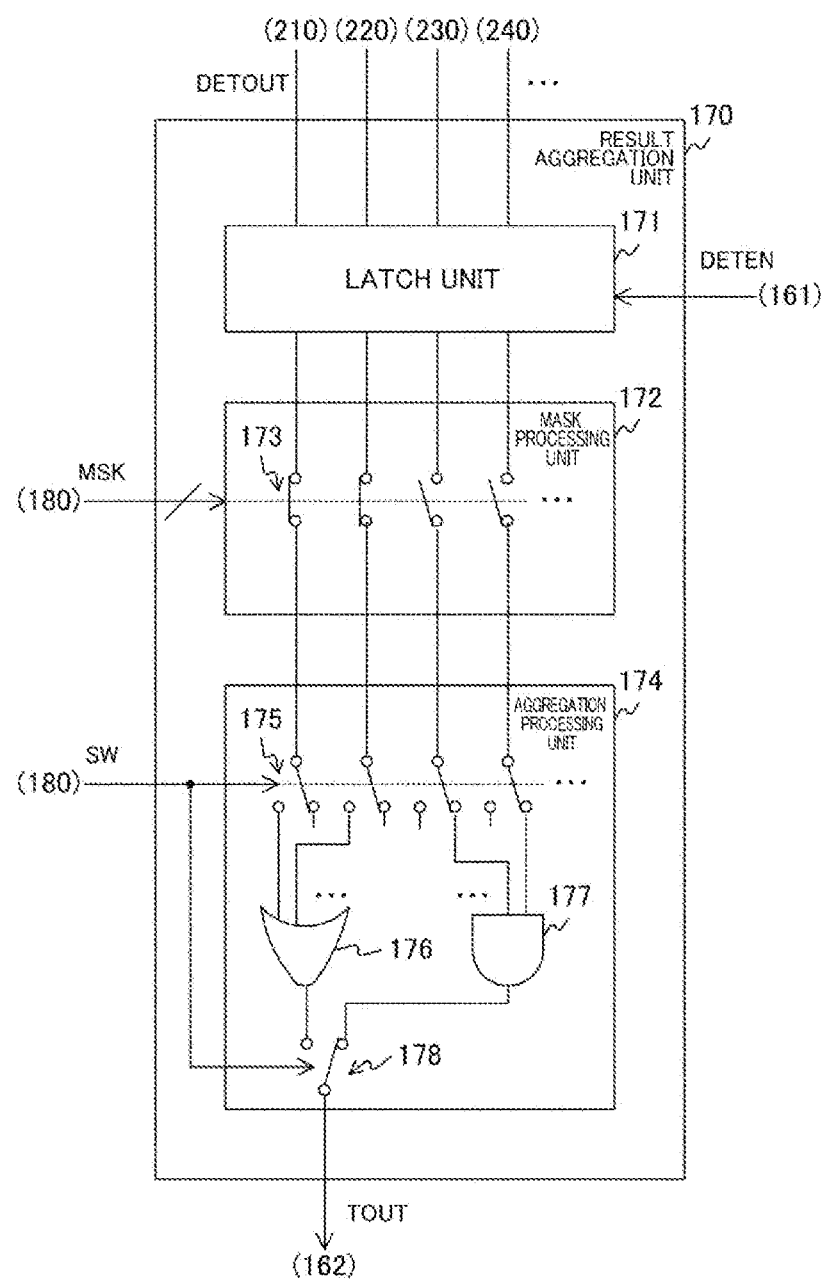
FIG. 16 is a block diagram showing an exemplary configuration of a result aggregation unit according to the first embodiment of the present technology.

FIG. 16 is a block diagram showing an exemplary configuration of the result aggregation unit 170 according to the first embodiment of the present technology. The result aggregation unit 170 includes a latch unit 171, a mask processing unit 172, and an aggregation processing unit 174.

The latch unit 171 latches the detection signals DETOUT and outputs them to the mask processing unit 172 in a period during which the control signal DETEN from the detection control unit 161 is at a high level (that is, in the enabled case). A latch circuit (not shown) is arranged in the latch unit 171 for each detection circuit.

The mask processing unit 172 masks each detection signal DETOUT according to a mask signal MSK from the common control unit 180. A switch 173 is arranged in the mask processing unit 172 for each detection circuit. Each switch 173 outputs a corresponding detection signal DETOUT to the aggregation processing unit 174 according to the mask signal MSK. The central arithmetic unit or the test device 300 can allow only a detection signal DETOUT of a specific location among a plurality of detection target locations to be output by the mask signal MSK.

The aggregation processing unit 174 aggregates a plurality of detection signals DETOUT and generates a signal indicating whether or not there is an abnormality in at least one of the plurality of detection circuits as an output signal TOUT. The aggregation processing unit 174 includes a plurality of selectors 175, an OR (logical sum) gate 176, an AND (logical product) gate 177, and a selector 178. The selector 175 is provided for each detection circuit.

The selector 175 switches the output destination of the corresponding detection signal DETOUT to either the OR gate 176 or the AND gate 177 according to a switching signal SW from the common control unit 180. Here, the logical value of the switching signal SW is set according to whether or not the value of the detection signal DETOUT indicating an abnormality or failure is at a high level.

When the value of the detection signal DETOUT indicating an abnormality or the like is at a high level, the detection signal DETOUT is output to the OR gate 176 by the switching signal SW. On the other hand, when the value of the detection signal DET OUT indicating an abnormality or the like is at a low level, the detection signal DETOUT is output to the AND gate 177 by the switching signal SW.

The OR gate 176 outputs the logical sum of the plurality of detection signals DETOUT to the selector 178. The AND gate 177 outputs the logical product of the plurality of detection signals DETOUT to the selector 178.

The selector 178 switches the input destination to either the OR gate 176 or the AND gate 177 according to the switching signal SW and outputs a signal from the gate to the output control unit 162 as an output signal TOUT. When the output destination of the detection signal DETOUT is switched to the OR gate 176 by the switching signal SW, the input destination is also switched to the OR gate 176 by the selector 178. On the other hand, when the output destination of the detection signal DETOUT is switched to the AND gate 177 by the switching signal SW, the input destination is also switched to the AND gate 177 by the selector 178.

According to the configuration illustrated in FIG. 16, a signal indicating whether or not there is an abnormality or failure in at least one of the plurality of detection locations is generated as an output signal TOUT. The central arithmetic unit or the test device 300 detects the presence or absence of an abnormality or failure based on the output signal TOUT, and if there is an abnormality or the like, the mask signal MSK narrows down the detection signal to narrow down the location where the abnormality or the like has occurred.

The configuration of the result aggregation unit 170 is not limited to that illustrated in FIG. 16. For example, switching by the switching signal SW is unnecessary when the value of the detection signal DETOUT indicating an abnormality or the like is fixed to a high level or a low level. In this case, the selectors 175 and 178 and one of the OR gate 176 and the AND gate 177 are unnecessary.

Figure 17:
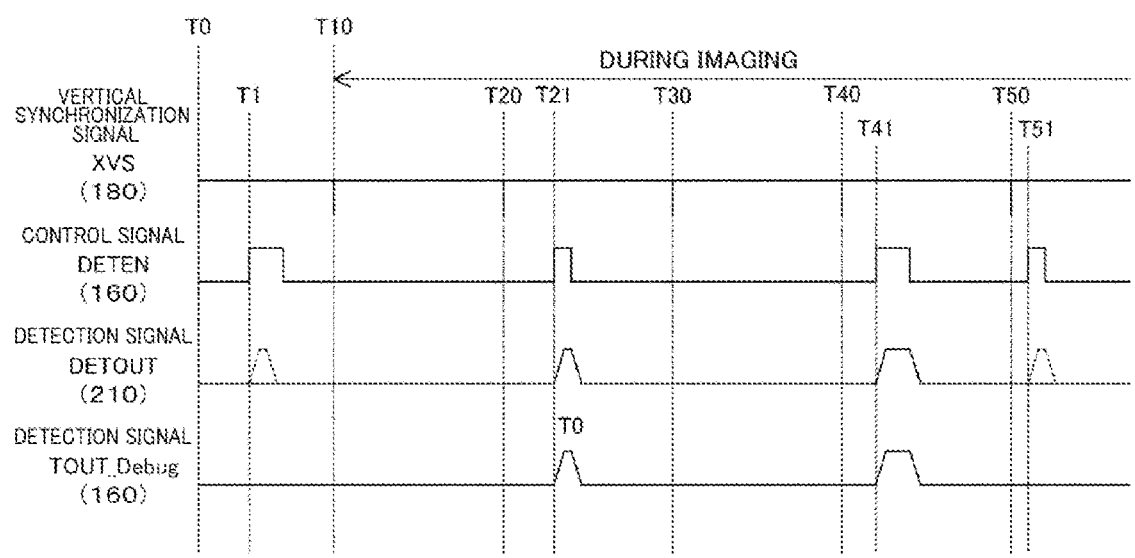
FIG. 17 is a timing chart showing an example of an operation of a solid-state imaging device in a manual mode according to the first embodiment of the present technology.

FIG. 17 is a timing chart showing an example of an operation of the solid-state imaging device 100 in the manual mode according to the first embodiment of the present technology. The operation of FIG. 17 starts, for example, after the semiconductor substrates 101 and 102 are bonded together.

It is assumed that the imaging operation of the solid-state imaging device 100 stops during a period from timing T0 to T10. This state is hereinafter referred to as a "standby" state. It is assumed that, at timing T1 in the standby period, an operation signal corresponding to a user operation is transmitted from the central arithmetic unit or the test device 300 to the solid-state imaging device 100 via an interface of the I2C standard or the like. The detection circuit control unit 160 in the solid-state imaging device 100 supplies a high level (enable) control signal DETEN to the detection circuit 210 and the like over a predetermined pulse period. If the semiconductor substrates are not peeled off at this time, the detection circuit 210 outputs a low level detection signal DETOUT.

At and after timing T10, the solid-state imaging device 100 acquires image data in synchronization with a vertical synchronization signal XVS. For example, the common control unit 180 generates a vertical synchronization signal XVS at timings T10, T20, T30, T40, and so on.

It is assumed that an operation signal corresponding to a user operation is transmitted via an interface of the I2C standard or the like at timings T21, 41 and 51 during imaging. At each timing, the detection circuit control unit 160 supplies a high level (enable) control signal DETEN to the detection circuit 210 and the like over a predetermined pulse period.

Further, it is assumed that, at timings T21 and T41, a detection circuit 210 detects that a semiconductor substrate has been peeled off and outputs a high level detection signal DETOUT. The detection circuit control unit 160 aggregates detection circuits DETOUT and outputs the aggregated signal as a high level output signal TOUT_Debug.

In the manual mode, the detection circuit control unit 160 supplies a control signal DETEN that has been set to enable when an operation signal has been input over a predetermined period as illustrated in FIG. 17. An operation signal can be input at any timing during both standby and imaging.

Figure 18:
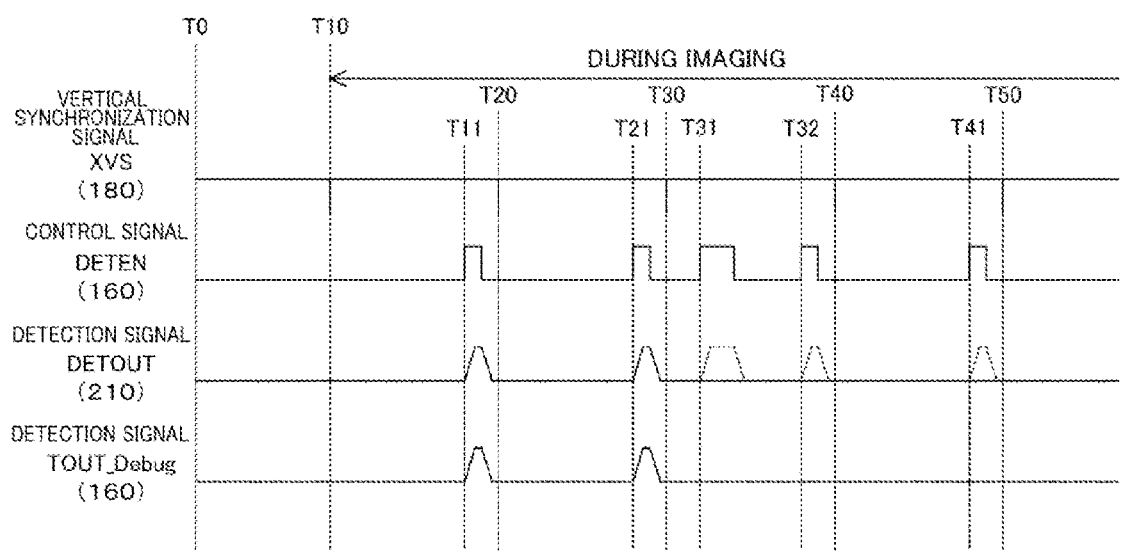
FIG. 18 is a timing chart showing an example of an operation of the solid-state imaging device in an autorun mode according to the first embodiment of the present technology.

FIG. 18 is a timing chart showing an example of an operation of the solid-state imaging device 100 in the autorun mode according to the first embodiment of the present technology. The operation of FIG. 18 starts, for example, after the semiconductor substrates 101 and 102 are bonded together.

During a period from timing T0 to T10, the solid-state imaging device 100 is in a standby state. At and after timing T10, the solid-state imaging device 100 acquires image data in synchronization with a vertical synchronization signal XVS. For example, the common control unit 180 generates a vertical synchronization signal XVS at timings T10, T20, T30, T40, T50, and so on.

The detection circuit control unit 160 supplies a high level (enable) control signal DETEN in synchronization with a vertical synchronization signal XVS over a predetermined pulse period. A high level control signal DETEN is supplied, for example, at timings T11, T21, T32 and T41 respectively immediately before timings T20, T30, T40, and T50.

Further, if an operation signal is input at timing T31 during imaging, the detection circuit control unit 160 supplies a high level (enable) control signal DETEN over a predetermined pulse period.

At timings T11 and T21, a detection circuit 210 detects that a semiconductor substrate has been peeled off and outputs a high level detection signal DETOUT. The detection circuit control unit 160 aggregates detection circuits DETOUT and outputs the aggregated signal as a high level output signal TOUT_Debug.

In the autorun mode, the detection circuit control unit 160 supplies a control signal DETEN that has been set to enable over a predetermined period in synchronization with a vertical synchronization signal. The detection circuit control unit 160 also supplies a control signal DETEN that has been set to enable over a predetermined period when an operation signal has been input. An operation signal can be input at any timing during both standby and imaging.

The test illustrated in FIGS. 17 and 18 can be performed at the time of shipment or at the time of starting the solid-state imaging device 100 after shipment.

Figure 19:
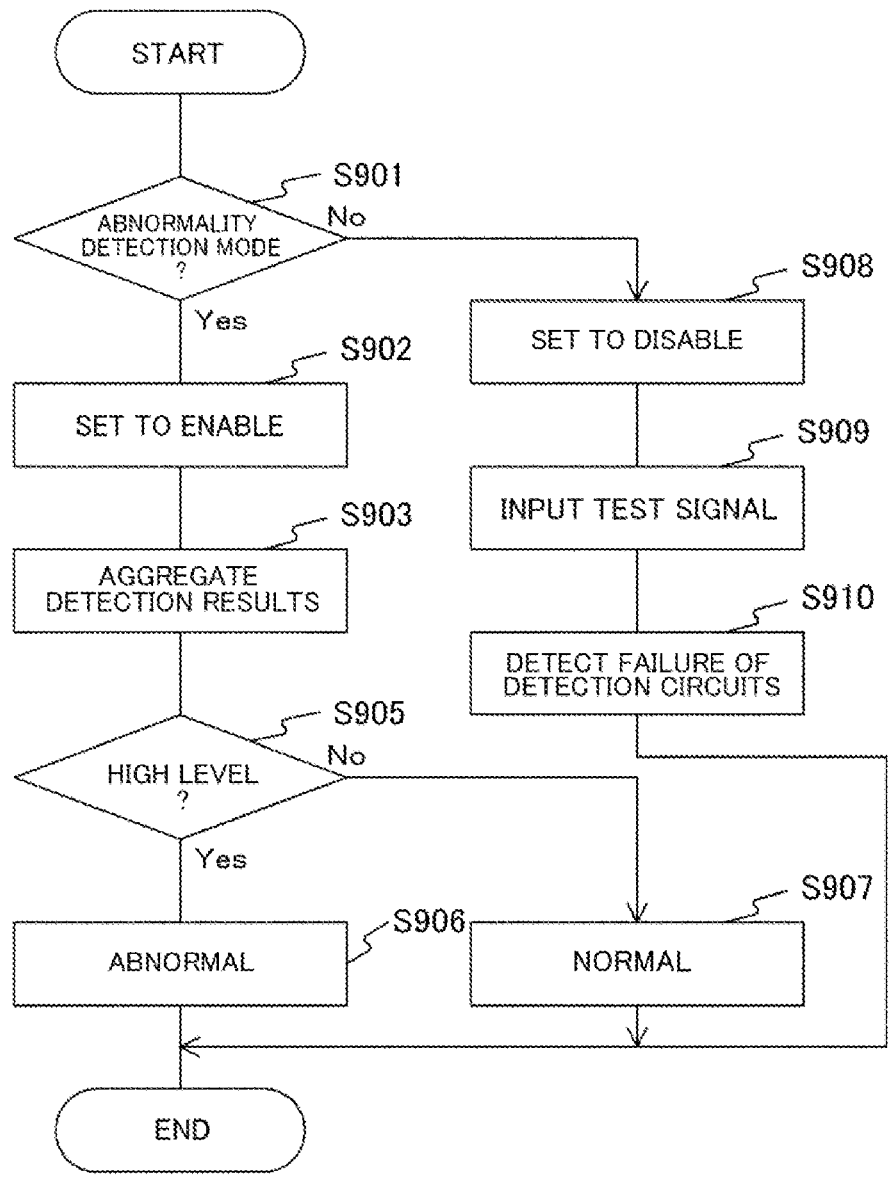
FIG. 19 is a flowchart showing an example of an operation of a test system according to the first embodiment of the present technology.

FIG. 19 is a flowchart showing an example of an operation of the test system according to the first embodiment of the present technology. This operation starts, for example, after the semiconductor substrates 101 and 102 are bonded together.

The solid-state imaging device 100 determines whether or not the abnormality detection mode has been set (step S901). When the abnormality detection mode has been set (step S901: Yes), the detection circuit control unit 160 in the solid-state imaging device 100 sets the control signal DETEN to enable (step S902). Then, when detection signals have been output from detection circuits, the detection circuit control unit 160 aggregates the detection signals and outputs the aggregated signal as an output signal TOUT (step S903). The central arithmetic unit or the test device 300 determines whether or not the output signal TOUT is at a high level (step S905).

When the output signal TOUT is at a high level (step S905: Yes), the central arithmetic unit or the test device 300 determines that there is an abnormality due to peeling or position displacement (step S906). On the other hand, when the output signal TOUT is at a low level (step S905: No), the central arithmetic unit or the test device 300 determines that there is no abnormality and the condition is normal (step S907).

Before bonding, it is determined that the condition is normal if the output signal TOUT is at a high level and it is determined that there is an abnormality due to a short circuit if the output signal TOUT is at a low level.

On the other hand, when the test passage mode has been set (step S901: No), the detection circuit control unit 160 sets the control signal DETEN to disable (step S908) and inputs a test signal TSTIN to the detection circuits (step S909). Then, the central arithmetic unit or the test device 300 compares the test signal TSTIN with the output signal TOUT and detects the presence or absence of a failure in the detection circuits (step S910). After step S906, S907 or S910, the test system terminates the abnormality or failure detection operation.

According to the first embodiment of the present technology, the detection circuit 210 detects the presence or absence of an abnormality in a joint surface between a plurality of substrates based on the energization state of a connection line wired across the plurality of substrates as described above. Because this connection line (a power line or a ground line) can be wired in an area other than the pixel array unit, it is possible to improve the degree of freedom of the abnormality detection target location.

2. Second Embodiment

While the solid-state imaging device 100 outputs the output signal TOUT_Debug indicating the detection result over a predetermined pulse period in the first embodiment described above, the central arithmetic unit or the test device 300 may fail to acquire the output signal TOUT_Debug if the pulse period is short. The solid-state imaging device 100 of a second embodiment differs from that of the first embodiment in that detection results are held and their held values are read by the central arithmetic unit or the test device 300.

Figure 20:
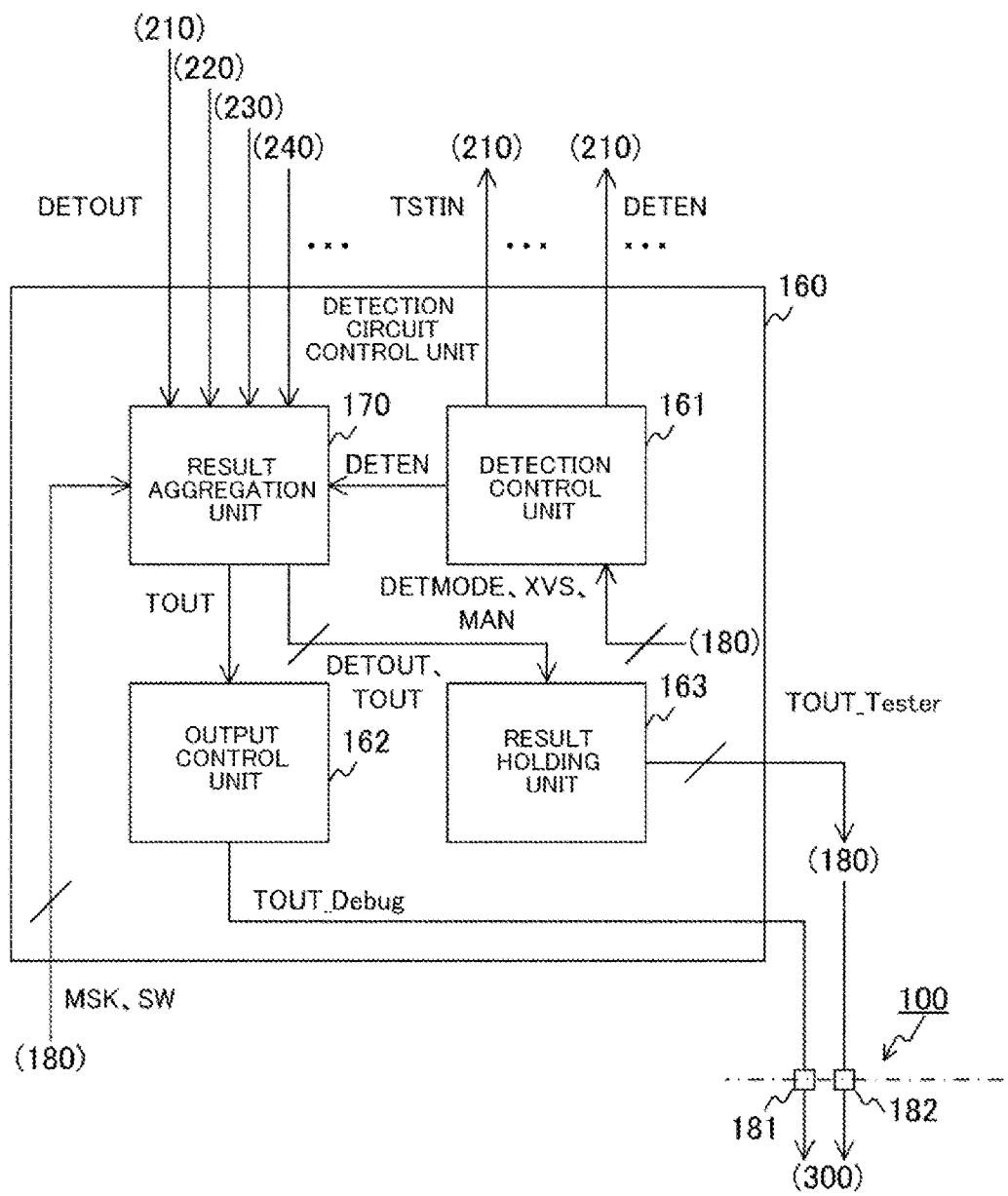
FIG. 20 is a block diagram showing an exemplary configuration of a detection circuit control unit according to a second embodiment of the present technology.

FIG. 20 is a block diagram showing an exemplary configuration of the detection circuit control unit 160 according to the second embodiment of the present technology. The detection circuit control unit 160 of the second embodiment differs from that of the first embodiment in that it further includes a result holding unit 163.

Further, the result aggregation unit 170 of the second embodiment supplies the output signal TOUT and the detection signals DETOUT of the plurality of detection circuits to the result holding unit 163.

The result holding unit 163 holds the output signal TOUT and the detection signals DETOUT of the plurality of detection circuits. Registers for signals to be held are provided in the result holding unit 163. For example, when the number of detection circuits is N (where N is an integer), a number of registers corresponding to N+1 bits are provided. Output terminals of the registers are connected to N+1 output terminals including the output terminal 182 via the common control unit 180. Through these terminals, the held values are output as output signals TOUT_Tester.

The registers in the result holding unit 163 are initialized at a predetermined timing (such as timing immediately before the start of the test) by a signal from the common control unit 180 or the like.

Figure 21:
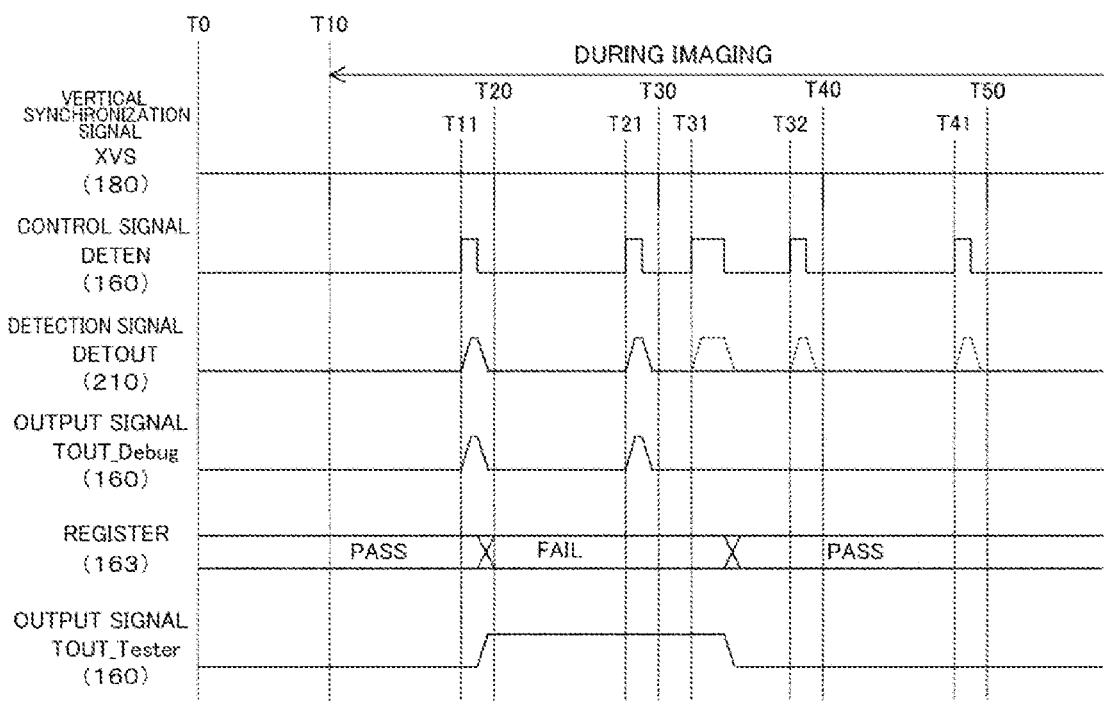
FIG. 21 is a timing chart showing an example of an operation of a solid-state imaging device in an autorun mode according to the second embodiment of the present technology.

FIG. 21 is a timing chart showing an example of an operation of the solid-state imaging device in the autorun mode according to the second embodiment of the present technology. Here, either a debug mode or a tester mode is set in the central arithmetic unit or the test device 300. The debug mode is a mode in which the output signal TOUT_Debug is analyzed. On the other hand, the tester mode is a mode in which output signals TOUT_Tester are read from the registers and analyzed.

The operation of FIG. 21 starts, for example, after the semiconductor substrates 101 and 102 are bonded together. During a period from timing T0 to T10, the solid-state imaging device 100 is in a standby state. At and after timing T10, the solid-state imaging device 100 acquires image data in synchronization with a vertical synchronization signal XVS. For example, the common control unit 180 generates a vertical synchronization signal XVS at timings T10, T20, T30, T40, T50, and so on.

The detection circuit control unit 160 supplies a high level (enable) control signal DETEN in synchronization with a vertical synchronization signal XVS over a predetermined pulse period. A high level control signal DETEN is supplied, for example, at timings T11, T21, T32 and T41 respectively immediately before timings T20, T30, T40, and T50.

In an initial state, each register in the result holding unit 163 is initialized to a value indicating normality (for example, a logical value of "0"). "PASS" in FIG. 21 indicates that the held value of the register is a value indicating normality.

At timings T11 and T21, a detection circuit 210 detects that a semiconductor substrate has been peeled off and outputs a high level detection signal DETOUT. This high level detection signal is held in a register. "FAIL" in FIG. 21 indicates that the held value of the register is a value indicating an abnormality.

When the detection circuit 210 outputs a low level detection signal DETOUT at timing T31, the value of the register becomes the value of the low level detection signal DETOUT (the initial value).

In the debug mode, the central arithmetic unit or the test device 300 analyzes the output signal TOUT_Debug as in the first embodiment. On the other hand, in the tester mode, the central arithmetic unit or the test device 300 reads a high level signal from the register as an output signal TOUT_Tester with the value held until immediately after timing T31 starting from timing T20 and analyzes the read signal. The output period of the high level output signal TOUT_Tester is sufficiently longer than the output period of the high level output signal TOUT_Debug as illustrated in FIG. 21. Therefore, setting the tester mode allows the central arithmetic unit or the test device 300 to acquire the value of each output signal before the value of the output signal is initialized after an abnormality occurs.

FIGS. 22A, 22B, and 22C are diagrams summarizing modes set in the test system according to the second embodiment of the present technology. FIG. 22A shows modes set in each detection circuit. FIG. 22B shows modes set in the detection circuit control unit 160. FIG. 22C shows modes set in the central arithmetic unit or the test device 300.

As illustrated in FIG. 22A, an abnormality detection mode and a test passage check mode are set in the detection circuit. In the abnormality detection mode, enable is set by the control signal DETEN and the detection circuit detects the presence or absence of an abnormality such as peeling or short-circuiting of the substrates. On the other hand, in the test passage check mode, enable is set by the control signal DETEN and the detection circuit outputs an output signal according to the test signal.

As illustrated in FIG. 22B, a manual mode and an autorun mode are set in the detection circuit control unit 160. In the manual mode, the detection circuit control unit 160 supplies a high level (enable) control signal DETEN in response to an operation signal corresponding to a user peration. On the other hand, in the autorun mode, the detection circuit control unit 160 supplies a high level control signal DETEN in synchronization with a vertical synchronization signal XVS or in response to an operation signal.

As illustrated in FIG. 22C, a debug mode and a tester mode are set in the central arithmetic unit or the test device 300. In the debug mode, the central arithmetic unit or the test device 300 analyzes an output signal TOUT_Debug that is not held in the registers. On the other hand, in the tester mode, the central arithmetic unit or the test device 300 reads an output signal TOUT_Tester from a register and analyzes the read output signal. The modes in FIGS. 22A, 22B, and 22C may be applied in any combination.

According to the second embodiment of the present technology, the central arithmetic unit or the test device 300 can acquire the value of each output signal before the value of the output signal is initialized after an abnormality occurs because the result holding unit 163 holds the output signal as described above.

3. Exemplary Application to Moving Body

The technology according to the present disclosure (the present technology) can be applied to various products. For example, the technology according to the present disclosure may be realized as a device mounted in a moving body of any type such as an automobile, an electric vehicle, a hybrid electric vehicle, a motorcycle, a bicycle, a personal mobility, an airplane, a drone, a ship, or a robot.

Figure 23:
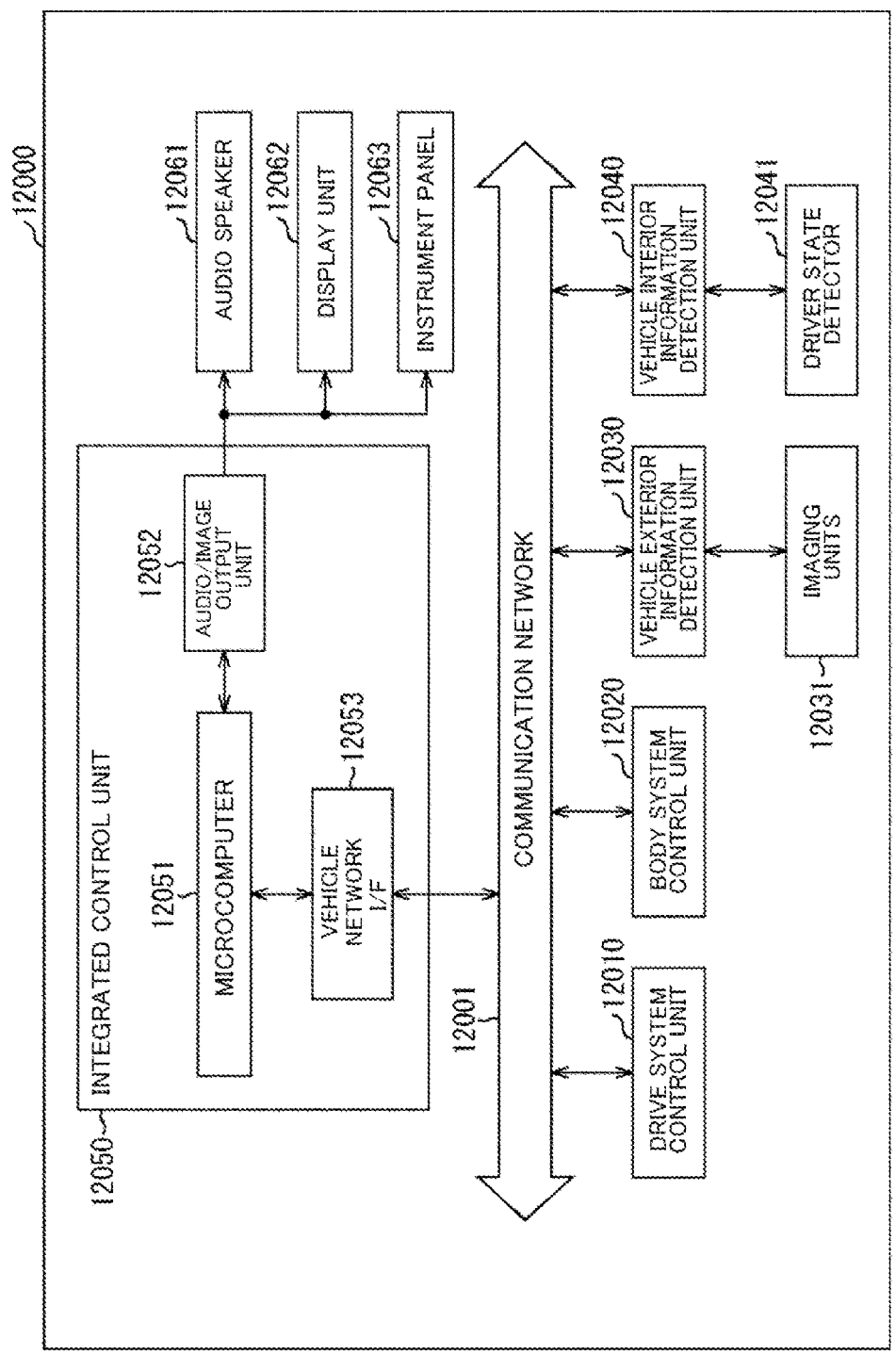
FIG. 23 is a block diagram showing an exemplary schematic configuration of a vehicle control system.

FIG. 23 is a block diagram showing an exemplary schematic configuration of a vehicle control system which is an example of a mobile body control system to which the technology according to the present disclosure can be applied.

The vehicle control system 12000 includes a plurality of electronic control units connected via a communication network 12001. In the example shown in FIG. 23, the vehicle control system 12000 includes a drive system control unit 12010, a body system control unit 12020, a vehicle exterior information detection unit 12030, a vehicle interior information detection unit 12040, and an integrated control unit 12050. A microcomputer 12051, an audio/image output unit 12052, and an in-vehicle network interface (I/F) 12053 are also shown as functional components of the integrated control unit 12050.

The drive system control unit 12010 controls the operation of devices relating to the drive system of the vehicle according to various programs. For example, the drive system control unit 12010 functions as a control device for a driving force generation device for generating the driving force of the vehicle such as an internal combustion engine or a drive motor, a driving force transmission mechanism for transmitting the driving force to the wheels, a steering mechanism for adjusting the steering angle of the vehicle, a braking device for generating the braking force of the vehicle, or the like.

The body system control unit 12020 controls the operation of various devices mounted in the vehicle body according to various programs. For example, the body system control unit 12020 functions as a control device for a keyless entry system, a smart key system, a power window device, or various lamps such as headlamps, back lamps, brake lamps, blinkers, or fog lamps. In this case, radio waves transmitted from a portable device that substitutes for the key or signals of various switches may be input to the body system control unit 12020. The body system control unit 12020 receives inputs of these radio waves or signals and controls a door lock device, the power window device, the lamps, and the like of the vehicle.

The vehicle exterior information detection unit 12030 detects information outside the vehicle in which the vehicle control system 12000 is mounted. For example, imaging units 12031 are connected to the vehicle exterior information detection unit 12030. The vehicle exterior information detection unit 12030 causes the imaging units 12031 to capture images outside the vehicle and receives the captured images. The vehicle exterior information detection unit 12030 may perform object detection processing or distance detection processing on a person, a vehicle, an obstacle, a sign, a character on a road surface, or the like based on the received images.

Each imaging unit 12031 is an optical sensor that receives light and outputs an electric signal according to the amount of received light. The imaging unit 12031 can output an electric signal as an image or as distance measurement information. Light received by the imaging unit 12031 may be visible light or invisible light such as infrared light.

The vehicle interior information detection unit 12040 detects vehicle interior information. For example, a driver state detector 12041 that detects the driver's state is connected to the vehicle interior information detection unit 12040. The driver state detector 12041 may include, for example, a camera that captures the driver and the vehicle interior information detection unit 12040 may calculate the degree of fatigue or concentration of the driver based on detection information input from the driver state detector 12041 and may determine whether the driver is dozing or not.

The microcomputer 12051 can calculate a control target value for the driving force generation device, the steering mechanism, or the braking device based on information inside and outside the vehicle acquired by the vehicle exterior information detection unit 12030 or the vehicle interior information detection unit 12040 and output a control command to the drive system control unit 12010. For example, the microcomputer 12051 can perform cooperative control for the purpose of realizing the functions of an advanced driver assistance system (ADAS) including vehicle collision avoidance or impact mitigation, following travel based on an inter-vehicle distance, vehicle speed maintenance travel, vehicle collision warning, or vehicle lane deviation warning.

The microcomputer 12051 can also perform cooperative control for the purpose of automated driving for the vehicle to travel autonomously without relying on the driver's operation or the like by controlling the driving force generation device, the steering mechanism, the braking device, or the like based on information around the vehicle acquired by the vehicle exterior information detection unit 12030 or the vehicle interior information detection unit 12040.

The microcomputer 12051 can also output a control command to the body system control unit 12020 based on the information outside the vehicle acquired by the vehicle exterior information detection unit 12030. For example, the microcomputer 12051 can perform cooperative control for the purpose of preventing glare such as controlling the headlamps to switch a high beam to a low beam according to the position of a preceding vehicle or an oncoming vehicle detected by the vehicle exterior information detection unit 12030.

The audio/image output unit 12052 transmits an output signal which is at least one of audio and an image to an output device capable of visually or audibly providing notification information to the passenger of the vehicle or the outside of the vehicle. In the example of FIG. 23, an audio speaker 12061, a display unit 12062, and an instrument panel 12063 are illustrated as output devices. The display unit 12062 may include, for example, at least one of an onboard display and a heads-up display.

Figure 24:
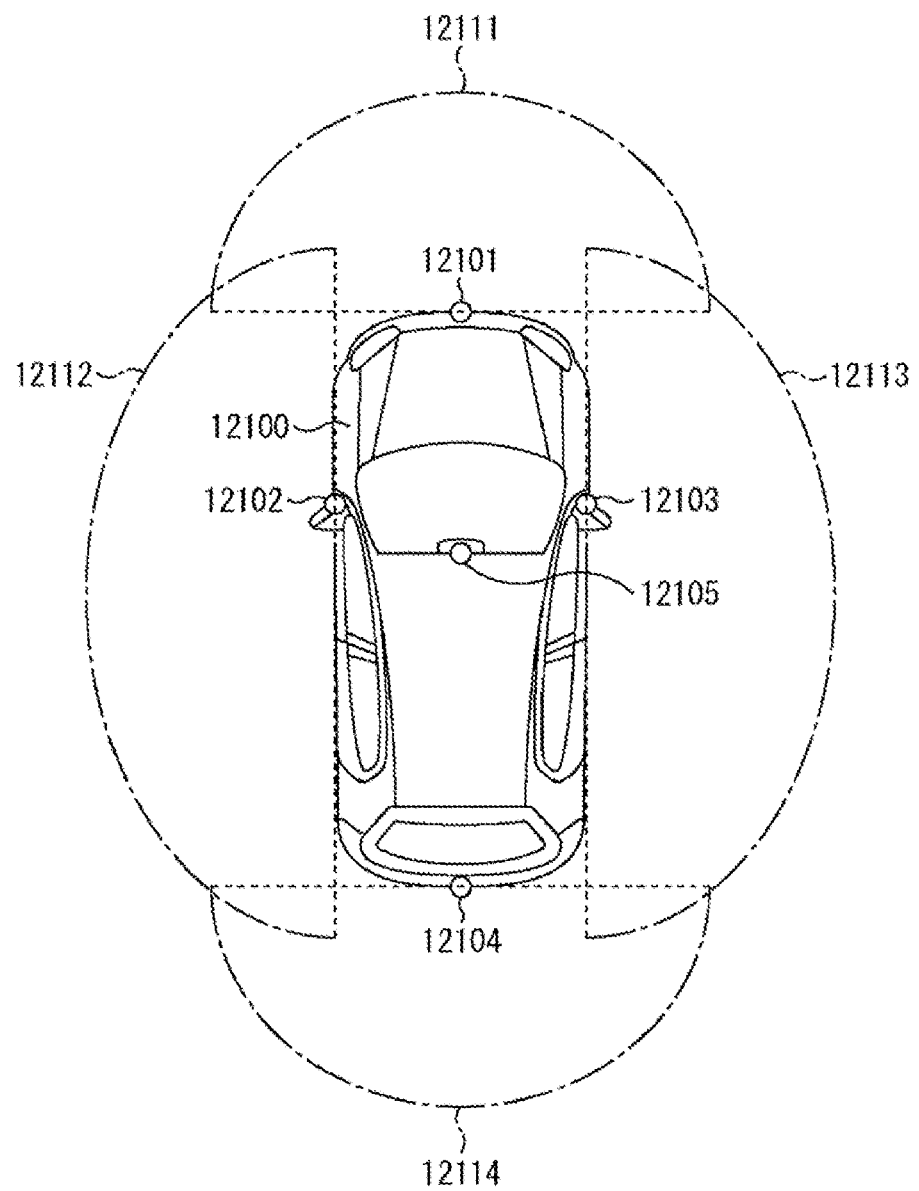
FIG. 24 is an explanatory diagram showing an example of installation positions of imaging units.

FIG. 24 shows an example of the installation positions of the imaging units 12031.

In FIG. 24, imaging units 12101, 12102, 12103, 12104, and 12105 are provided as the imaging units 12031.

The imaging units 12101, 12102, 12103, 12104, and 12105 are provided, for example, at positions such as a front nose, side mirrors, a rear bumper, a back door, and an upper part of a windshield in the occupant compartment of the vehicle 12100. The imaging unit 12101 provided on the front nose and the imaging unit 12105 provided on the upper part of the windshield in the occupant compartment mainly acquire images in front of the vehicle 12100. The imaging units 12102 and 12103 provided on the side mirrors mainly acquire images on the sides of the vehicle 12100. The imaging unit 12104 provided on the rear bumper or the back door mainly acquires images behind the vehicle 12100. The imaging unit 12105 provided on the upper part of the windshield in the occupant compartment is mainly used to detect a preceding vehicle, a pedestrian, an obstacle, a traffic light, a traffic sign, a lane, or the like.

FIG. 24 also shows an example of the imaging ranges of the imaging units 12101 to 12104. The imaging range 12111 indicates the imaging range of the imaging unit 12101 provided on the front nose, the imaging ranges 12112 and 12113 indicate the imaging ranges of the imaging units 12102 and 12103 provided on the side mirrors, respectively, and the imaging range 12114 indicates the imaging range of the imaging unit 12104 provided on the rear bumper or the back door. For example, an overhead view image of the vehicle 12100 as viewed from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging devices or may be an imaging device having pixels for phase difference detection.

For example, the microcomputer 12051 can especially extract a three-dimensional object, which is the closest to on a traveling path of the vehicle 12100 and is traveling in substantially the same direction as the vehicle 12100 at a predetermined speed (for example, 0 km/h or more), as a preceding vehicle by obtaining distances to three-dimensional objects within the imaging ranges 12111 to 12114 and temporal changes of the distances (relative velocities with respect to the vehicle 12100) based on the distance information obtained from the imaging units 12101 to 12104. Further, the microcomputer 12051 can set an inter-vehicle distance to be secured in advance with respect to the preceding vehicle and perform automatic braking control (including following stop control), automatic acceleration control (including following start control), and the like. In this way, it is possible to perform cooperative control for the purpose of automated driving for the vehicle to travel autonomously without relying on the driver's operation or the like.

For example, the microcomputer 12051 can classify three-dimensional object data relating to three-dimensional objects into that of a two-wheeled vehicle, an ordinary vehicle, a large vehicle, a pedestrian, an electric pole, and other three-dimensional objects and extract those three-dimensional objects based on the distance information obtained from the imaging units 12101 to 12104 and use the extracted three-dimensional objects for automatic avoidance of obstacles. For example, the microcomputer 12051 identifies obstacles around the vehicle 12100 as obstacles that are visible to the driver of the vehicle 12100 and obstacles that are difficult to view. Then, the microcomputer 12051 can support driving for collision avoidance by determining a collision risk indicating the risk of collision with each obstacle, and when the collision risk is a set value or higher and there is a possibility of collision, outputting an alarm to the driver via the audio speaker 12061 or the display unit 12062 or performing forced deceleration and avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in captured images of the imaging units 12101 to 12104. Such pedestrian recognition is performed, for example, through a procedure of extracting feature points in the images captured by the imaging units 12101 to 12104 as infrared cameras and a procedure of performing pattern matching processing on a series of feature points indicating an outline of an object to determine whether or not the object is a pedestrian. When the microcomputer 12051 has determined that a pedestrian is present in the captured images of the imaging units 12101 to 12104 and recognized the pedestrian, the audio/image output unit 12052 controls the display unit 12062 such that a square contour line for emphasizing the recognized pedestrian is displayed superimposed on the recognized pedestrian. The audio/image output unit 12052 may also control the display unit 12062 such that an icon or the like indicating a pedestrian is displayed at a desired position.

An example of a vehicle control system to which the technology according to the present disclosure can be applied has been described above. The technology according to the present disclosure can be applied, for example, to each imaging unit 12031 among the components described above. Specifically, the solid-state imaging device 100 of FIG. 1 can be applied, for example, to the imaging unit 12031. By applying the technology according to the present disclosure to the imaging unit 12031, it is possible to detect the presence or absence of an abnormality or failure at any location and improve the reliability of the system.

The embodiments described above show examples for embodying the present technology and matters in the embodiments and matters specifying the invention in the claims have a correspondence to each other. Similarly, matters specifying the invention in the claims and matters in the embodiments of the present technology with the same names have a correspondence to each other. However, the present technology is not limited to the embodiments and can be embodied by making various modifications to the embodiments without departing from the gist of the present technology.

Further, the processing procedures described in the embodiments described above may be construed as a method having such a series of procedures or may be construed as a program for causing a computer to execute the series of procedures or a recording medium storing the program. For example, a compact disc (CD), a minidisc (MD), a digital versatile disc (DVD), a memory card, a Blu-ray (registered trademark) disc, or the like can be used as the recording medium.

The advantages described in the present specification are merely examples and are not limited and other advantages can also be achieved.

The present technology can also provide the following configurations.

(1) A semiconductor device including:
    a connection line that is wired across a plurality of semiconductor substrates to be joined; and
    a detection circuit configured to detect the presence or absence of an abnormality in a joint surface of the plurality of semiconductor substrates based on an energization state of the connection line when enable has been set by a predetermined control signal.

(2) The semiconductor device according to (1) above, wherein the detection circuit includes:
    a resistor; and
    an output-side logic gate configured to output a result of a logical operation performed on a potential at one end of the resistor.

(3) The semiconductor device according to (2) above, wherein the detection circuit further includes a transistor configured to be turned on when enable has been set by a predetermined control signal.

(4) The semiconductor device according to (3) above, wherein the transistor is inserted in at least one of a path between one end of the connection line and a power source, a path between the other end of the connection line and the resistor, and a path between the resistor and a reference potential.

(5) The semiconductor device according to (2) or (3) above, wherein the detection circuit further includes an input-side logic gate configured to output a result of a logic operation performed on an input test signal to the output-side logic gate when disable has been set by the control signal.

(6) The semiconductor device according to any one of (1) to (5) above, wherein a predetermined number of detection circuits are arranged in the semiconductor device, and
    the predetermined number of detection circuits are configured to output detection signals indicating detection results of different detection target locations.

(7) The semiconductor device according to (6) above, further including a result aggregation unit configured to generate an output signal indicating the presence or absence of an abnormality in at least one of the detection target locations based on the detection signals.

(8) The semiconductor device according to (7) above, further including a result holding unit configured to hold the output signal and the detection signals.

(9) The semiconductor device according to any one of (1) to (8) above, further including a detection control unit configured to generate and supply the control signal to the detection circuit.
(10) The semiconductor device according to (9) above, wherein the detection control unit is configured to supply the control signal that has been set to the enable over a predetermined period when a predetermined operation signal has been input.
(11) The semiconductor device according to (8) or (9) above, wherein the detection control unit is configured to supply the control signal that has been set to the enable over a predetermined period in synchronization with a predetermined synchronization signal.
(12) The semiconductor device according to (1) to (11) above, wherein the connection line includes:
a plurality of pairs of copper wirings joined to each other; and metal wirings that connect the plurality of pairs of copper wirings in a daisy chain.
(13) A test system including:
a connection line that is wired across a plurality of semiconductor substrates to be joined;
a detection circuit configured to detect the presence or absence of an abnormality in a joint surface of the plurality of semiconductor substrates based on an energization state of the connection line when enable has been set by a predetermined control signal; and
a detection unit configured to detect the presence or absence of a failure of the detection circuit when disable has been set by the control signal.

REFERENCE SIGNS LIST

100 Solid-state imaging device
101, 102 Semiconductor substrate
103, 104, 193, 194 Copper wiring
105, 195 Metal wiring
106, 196 Connection line
107, 108, 197, 198 Terminal
110 Pixel array unit
120 Scanning control unit
130 Read control unit
140 Signal processing unit
150 Output unit
160 Detection circuit control unit
161 Detection control unit
162 Output control unit
163 Result holding unit
170 Result aggregation unit
171 Latch unit
172 Mask processing unit
173 Switch
174 Aggregation processing unit
175, 178 Selector
176 OR (logical sum) gate
177 AND (logical product) gate
180 Common control unit
181, 182 Output terminal
199 Joint surface
210, 220, 230, 240 Detection circuit
211, 212, 216, 221 to 223 Inverter
213, 224 pMOS transistor
214, 225 Variable resistor
215, 226 nMOS transistor
227 Buffer
300 Central arithmetic unit or test device
12031 Imaging unit

The invention claimed is:
1. A semiconductor device, comprising:
a connection line that is-wired across a plurality of semiconductor substrates to be joined, wherein the plurality of semiconductor substrates corresponds to a plurality of detection target locations;
a plurality of detection circuits configured to output detection signals indicating detection results of the plurality of detection target locations, wherein each of the plurality of detection circuits is configured to:
detect presence or absence of an abnormality in a respective detection target location of the plurality of detection target locations; and
generate a respective detection signal of the detection signals based on an energization state of the connection line;
a result aggregation unit configured to:
aggregate the respective detection signal of each of the plurality of detection circuits; and
generate an output signal based on the aggregation of the respective detection signal of each of the plurality of detection circuits, wherein the output signal indicates the presence or the absence of the abnormality in at least one of the plurality of detection target locations.
2. The semiconductor device according to claim 1, wherein each of the plurality of detection circuits includes:
a resistor; and
an output-side logic gate configured to output a first result of a first logical operation on a potential at one end of the resistor.
3. The semiconductor device according to claim 2, wherein each of the plurality of detection circuits further includes a transistor configured to be turned on based on enable set by a specific control signal.
4. The semiconductor device according to claim 3, wherein the transistor is in at least one of a path between a first end of the connection line and a power source, a path between a second end of the connection line and the resistor, or a path between the resistor and a reference potential.
5. The semiconductor device according to claim 2, wherein each of the plurality of detection circuits further includes an input-side logic gate configured to output a second result of a second logic operation on an input test signal to the output-side logic gate based on disable set by a control signal.
6. The semiconductor device according to claim 1, further comprising a result holding unit configured to hold the output signal and the detection signals.
7. The semiconductor device according to claim 1, further comprising a detection control unit configured to generate and supply a control signal to the plurality of detection circuits.
8. The semiconductor device according to claim 7, wherein the detection control unit is further configured to supply the control signal that has been set to enable over a specific period when a specific operation signal has been input.
9. The semiconductor device according to claim 7, wherein the detection control unit is further configured to supply the control signal that has been set to enable over a specific period in synchronization with a specific synchronization signal.
10. The semiconductor device according to claim 1, wherein the connection line includes:
a plurality of pairs of copper wirings, wherein a first pair of copper wirings of the plurality of pairs of copper wirings is joined to a second pair of copper wirings of the plurality of pairs of copper wirings; and metal wirings that connect the plurality of pairs of copper wirings in a daisy chain.

11. A test system, comprising:

a connection line wired across a plurality of semiconductor substrates to be joined, wherein the plurality of semiconductor substrates corresponds to a plurality of detection target locations;

a plurality of detection circuits configured to output detection signals indicating detection results of the plurality of detection target locations, wherein each of the plurality of detection circuits is configured to:

detect presence or absence of an abnormality in a respective detection target location of the plurality of detection target locations; and generate a respective detection signal of the detection signals based on an energization state of the connection line in a case where enable is set by a specific control signal;

a result aggregation unit configured to:

aggregate the respective detection signal of each of the plurality of detection circuits; and generate an output signal based on the aggregation of the respective detection signal of each of the plurality of detection circuits, wherein the output signal indicates the presence or the absence of the abnormality in at least one of the plurality of detection target locations; and a detection unit configured to detect the presence or the absence of a failure of a respective detection circuit of the plurality of the detection circuits in a case where disable has been set by the specific control signal.

* * * * *